United States Patent
Tsuihiji et al.

(10) Patent No.: US 6,746,309 B2
(45) Date of Patent: Jun. 8, 2004

(54) METHOD OF FABRICATING A SEMICONDUCTOR DEVICE

(75) Inventors: Motoyuki Tsuihiji, Gunma (JP); Hirofumi Iinuma, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/931,554

(22) Filed: Aug. 16, 2001

(65) Prior Publication Data

US 2002/0006769 A1 Jan. 17, 2002

Related U.S. Application Data

(63) Continuation-in-part of application No. 09/537,829, filed on Mar. 29, 2000, now Pat. No. 6,299,513.

(30) Foreign Application Priority Data

| May 27, 1999 | (JP) | 11-148351 |
| May 27, 1999 | (JP) | 11-148352 |
| May 27, 1999 | (JP) | 11-148353 |
| Nov. 15, 1999 | (JP) | 11-324465 |
| Dec. 1, 2000 | (JP) | 2000-367653 |

(51) Int. Cl.[7] ............................................. B24B 1/00
(52) U.S. Cl. ................... 451/28; 451/41; 451/54; 264/37.29; 264/37.3
(58) Field of Search .................. 451/41, 54, 28; 264/37.29, 37.3, 37.18, 37.24, 140, 162

(56) References Cited

U.S. PATENT DOCUMENTS

| 5,102,594 A | * | 4/1992 | Burlet et al. | 264/101 |
| 5,240,656 A | * | 8/1993 | Scheeres | 264/297.1 |
| 5,755,614 A | * | 5/1998 | Adams et al. | 451/60 |
| 5,772,900 A | * | 6/1998 | Yorita et al. | 210/805 |
| 6,299,513 B1 | * | 10/2001 | Tsuihiji et al. | 451/88 |

FOREIGN PATENT DOCUMENTS

| JP | 11-19672 | 1/1999 | C02F/3/06 |

OTHER PUBLICATIONS

Patent Abstracts of Japan; 11–09672; Jan. 26,1999

* cited by examiner

Primary Examiner—Joseph J. Hail, III
Assistant Examiner—Alvin J. Grant
(74) Attorney, Agent, or Firm—Fish & Richardson P.C.

(57) ABSTRACT

Waste water generated by processing a semiconductor is filtered to be cleaned. Removable matters trapped by a first filter film are used as a second filter film. Filtering capciity is maintained by applying an external force such as bubbles to the second filter film. When removable matters are mixed with the filtered water, the filtered water is recirculated again to the tank in which the waste water is stored, and after it is checked that a desired inclusion rate has been reached filtration is started again.

7 Claims, 23 Drawing Sheets

FIG.12

COMPARISON OF WASTE WATER FILTRATION SYSTEM
OF THIS INVENTION WITH CONVENTIONAL APPARATUS

| ITEM | PROCESSING CAPACITY 5m³/h CONVENTIONAL APPARATUS | PROCESSING CAPACITY 5m³/h APPARATUS ACCORDING TO INVENTION |
|---|---|---|
| WASTE WATER PROCESSING CAPACITY(SS)pH | 300mg/L<br>5-7 | 900mg/L<br>3-11 |
| INITIAL COST | 1 | 0.33 |
| POWER CONSUMPTION | 23.8kW | 5.3kW |
| RUNNING COST | 1 | 0.2 |
| MAINTENANCE NATURE | ORDINARY | EASY |
| STRUCTURE | COMPLEX | SIMPLE |
| QUALITY OF FILTERED WATER | ○ | ○ |
| CATCHABILITY OF SLUDGE | ○ | ○ |
| FILTER | UF MODULE POLYOLEFIN HIGH POLYMER 2.5kg/cm² (PRESSURIZED) | POLYOLEFIN 0.4kg/cm² (SUCTION) |

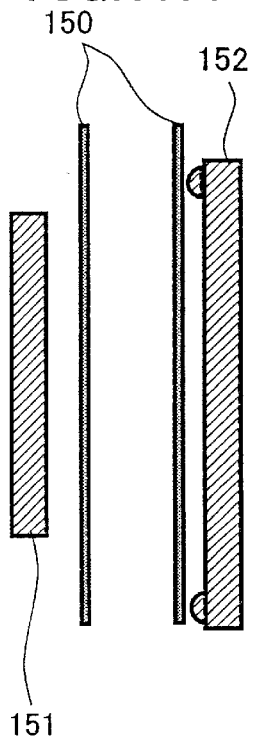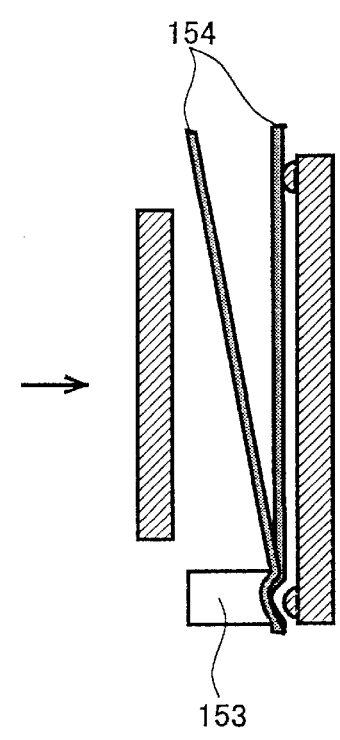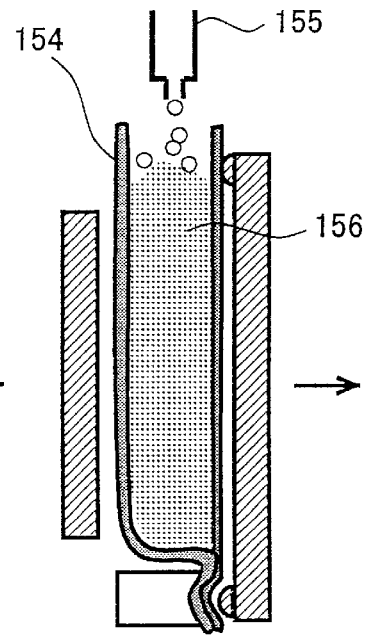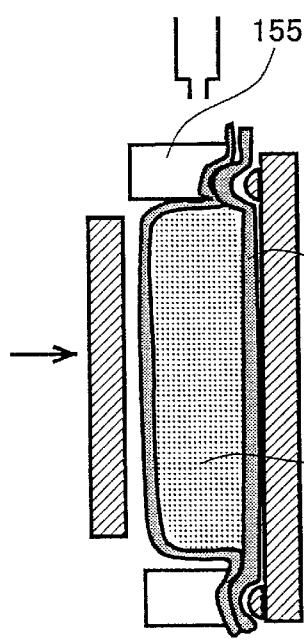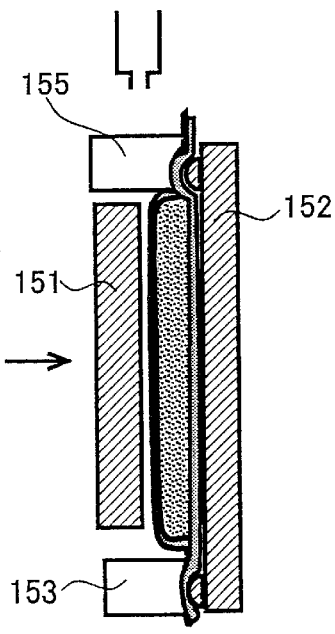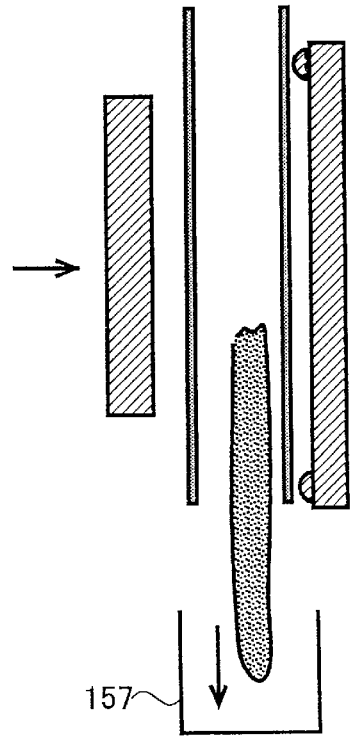

METHOD OF FABRICATING A SEMICONDUCTOR DEVICE

This application is a continuation-in-part of application Ser. No. 09/537,829 filed Mar. 29, 2000 now U.S. Pat. No. 6,299,513.

BACKGROUND OF THE INVENTION

1. Field of the Invention

This invention relates to a method of fabricating a semiconductor device, especially a method of processing an waste water generated in a step of forming a semiconductor device and reusing thereof.

2. Description of the Related Art

Generally, when grinding and polishing or milling of inorganic or organic solids such as metals and ceramics is carried out, fine particles are generated. These fine particles are generally washed away by means of a fluid such as water and discharged as wastewater or sewage. This invention relates to a system for reusing industrial wastewater.

Reducing industrial waste is a serious current ecological theme now and is an important business issue for the 21st century. Among industrial waste, there are various kinds of wastewater and sewage.

In the following description, water or other fluid substances containing matters to be removed will be called wastewater. Such wastewater has removable matters extracted by an expensive filtration processing apparatus or the like; the wastewater filtered becomes clean and is reused. Wastewater containing unremovable matters is further processed or disposed as industrial waste. Filtered water may be reused or returned to nature.

However, because of high plant costs related to running a filtration process, employing these apparatuses poses a very difficult problem.

Also, high costs of sewage treatment are a serious problem and therefore, a system with low initial cost and low running cost is urgently needed.

As an example, wastewater treatment in the semiconductor field will be described below. Generally, when grinding or polishing a metal, semiconductor or ceramic sheet, such factors as limiting temperature increases of equipment, improving lubrication, and preventing adhesion of waste produced by grinding and cutting the sheet are considered, and a fluid such as water is supplied to the sheet.

When semiconductor wafers are formed of ingot by grinding and slicing the ingot into wafers, or when a semiconductor wafer, which is a sheet of a semiconductor material, is diced or back-grinded, pure water is supplied. For preventing a temperature rise of a dicing blade in a dicing apparatus and for preventing dicing waste from adhering to the wafer, pure water is made to flow on the semiconductor wafer, or a nozzle for discharging water is mounted so that pure water will strike the blade and the wafer. Also, when the thickness of a wafer is reduced by back-grinding, pure water is supplied for similar reasons.

Wastewater containing semiconductor wafer grinding waste or polishing waste is filtered and thereby turned into clean water and returned to nature or reused, and concentrated wastewater is collected.

At present, there are two semiconductor manufacturing methods for processing wastewater containing mainly Si waste: a coagulating sedimentation method, and a method combining filtration and a centrifugal separator.

In the coagulating sedimentation method, PAC (polyaluminum chloride) or $Al_2(SO_4)_3$ (band sulfate), for example, is mixed with wastewater as a coagulant. Si reactants are produced, and the wastewater is cleaned by removing those reactants.

In the method of combining filtration and centrifugal separation, wastewater is filtered, and the concentrated wastewater is put in a centrifugal separator and collected as sludge. Water obtained by filtering the wastewater is discharged into nature or reused.

As shown in FIG. 13, wastewater produced during dicing is collected in a raw water tank 201 and fed by a pump 202 to a filtering apparatus 203. Because the filtering apparatus 203 is fitted with ceramic or organic filters F, filtered water is fed through a pipe 204 to a water tank 205 and reused, or it is discharged to the environment.

Since the filters F gets clogged, the filtering apparatus 203 is periodically washed. This is accomplished by, for example, closing a valve B1 on the raw water tank 201, opening a valve B3 and a valve B2 for feeding washing water to the raw water tank 201, and back-washing the filters F with water from the water tank 205. Wastewater with highly concentrated Si waste is returned to the raw water tank 201. Concentrated water in a concentrated water tank 206 is transported through a pump 208 to a centrifugal separator 209, and is separated by the centrifugal separator 209 into sludge and liquid. The sludge containing Si is collected in a sludge collecting tank 210, and the liquid is collected in a liquid tank 211. Also, water of the liquid tank 211 in which separated liquid is collected is transported through a pump 212 to the raw water tank 201.

Similar methods to those above have also been employed in the collection of waste produced by grinding and polishing solids and sheets having metal materials such as Cu, Fe, Al as their main waste material and solids and sheets made of inorganic materials such as ceramics.

In the coagulating sedimentation method, a chemical as a coagulant is mixed with the filtered water. However it is very difficult to determine the necessary and sufficient amount of chemical that the Si waste will completely react with, and inevitably excess chemical is introduced and some chemical will remain unreacted. In contrast, if the amount of chemical is low, not all the Si waste will coagulate and some Si waste will remain in the solution.

When the amount of chemical is excessive, some chemical remain in the supernatant liquid. The supernatant liquid may not be reusable because of possible undesirable chemical reactions with the excess chemical. For example, filtered water with the excess chemical cannot be reused on a wafer during dicing, because it causes an undesirable chemical reaction.

Floc, a reactant of chemical and silicon waste, is produced as a suspended solid. For forming floc, the pH conditions are strict; pH of about 6 to 8 must be maintained using an agitator, a pH measuring apparatus, a coagulant pouring device and control devices. For example, for a wastewater processing capacity of 3 $m^3$/hour, a tank with a diameter of 3 meters and a depth of 4 meters (a sedimentation tank of about 15 $m^3$) would be necessary, and it becomes a large system requiring an installation area of about 11 meters×11.

Furthermore, some floc may not settle and drift out of the tank, making the collection difficult. Hence, there are problems such as a high initial cost of the filtration system because of the plant size, difficulties of reusing the filtered water, and a high running cost of the system because a chemical is used.

The reuse of water is possible with the method combining filtration and a centrifugal separator of 5 $m^3$/hour because filters F (those made from polysulfone fiber, called UF modules, or ceramic filters) are used in the filtering apparatus 203. However, four filters F are installed in the filtering apparatus 203, and because the life of the filters F is about a year, it is necessary to replace the expensive (approximately 500,000 yen/unit) filter at least once a year. Furthermore, the load on the motor of the pump 202 for applying water to the filtering apparatus 203 is large because the filtration method is such that the filters F are of a pressurized type, and the pump 202 is a high-capacity type. Of the wastewater passing through the filters F, about ⅔ is returned to the raw water tank 201. Also, because wastewater containing silicon waste is transported by the pump 202, the internal walls of the pump 202 are scratched, cutting the life of the pump 202 short.

Hence, the cost of electricity for the motor is high and the running cost is also very high because there are replacement costs of the pump P and the filters F. FIG. 12 shows comparative data of the above system and a system of the invention described in the disclosure below. There are problems such as the size of the system, replacement of the filters, washing of the filters, and running costs.

To remove solid matter damaging to the earth's environment as much as possible, various devices must be added, and therefore, the filtration system, must necessarily becomes large, leading to enormous initial costs and running costs.

Further, using conventional filtering, the waste water in a waste water tank is at most 30 to 300 ppm. Thus, the amount of dust that enters the waste tank is limited, and the efficiency with which dust is collected is very low.

SUMMARY OF THE INVENTION

The invention provides a method of manufacturing a semiconductor device using a simple filtering method by which clean water can be obtained effectively.

The invention can solve the above-mentioned problems by removing removables included in a fluid with a filter made from at least some of those removables.

When a filter is made with removables, it is possible to form filter pores even smaller than the removables constituting the filter. Therefore it is possible to extract still smaller removables by way of these small pores.

The invention can pass a fluid (semiconductor wastewater) including removables through a first filter and form on the first filter surface a second filter consisting of the removables. The second filter can thereby remove other removables from the fluid.

On the first filter surface, a second filter made up of smaller pores than the pores of the first filter can be made to improve the filtering performance.

The invention can also recirculate a fluid including removables through a first filter to form on the first filter surface a second filter consisting of the removables.

As a result of recirculation, a second filter made up of smaller pores than the pores of the first filter grows on the first filter, and because small removables having passed through the first filter are also recirculated, the second filter is able to catch even smaller removables having passed through the pores of the first filter.

The first filter or the second filter can accommodate removables of different sizes.

The layered first and second filters with pores can pass fluid through and are able to catch small removables of different sizes in the wastewater.

The removables can have a particle diameter distribution having two peaks and the pores of the first filter can have a size between the two peaks.

With the pores of the first filter being between the two peaks, removables of the larger particle diameter are first trapped. Then as trapped removables are layered on the first filter in various arrangements, a second filter with smaller pores is formed. The second filter is then able to pass fluid and catch smaller removables.

The invention can detect with a detecting means the concentration of removables in the fluid passing through the first filter and can stop the recirculation when the concentration falls below a predetermined value.

A filtered fluid with mixtures of small removables can be recirculated to create a filter that will catch even those small removables. Therefore, by monitoring the fluid for a predetermined degree of concentration of removables as the fluid is recirculated, the fluid can be filtered to a target filtering accuracy.

The invention can further detect with a detecting means the concentration of removables in the fluid passing through the first filter, and can restart the recirculation when the concentration rises above a second predetermined value.

If the first filter breaks down or the second filter crumbles, the filtered water will contain removables that should have been filtered out, and this will create a problem during reuse. However, if a failure is detected, recirculation can be started immediately. This will prevent producing filtered water containing removables that should have been filtered.

The invention also can suck the fluid through the first filter.

For a sucking type, the reservoir tank of an open type can be used in which the fluid is stored and the filters are immersed. For a pressurized type, the reservoir tank must be sealed, and hence, this requires a complicated construction.

An external force may be applied to the second filter surface. Because the second filter consists of removables that have aggregated, if an external force is applied, it is possible to remove the whole of the second filter or a surface layer of the second filter to refresh and maintain the filtering performance.

The removables of the second filter surface can be desorbed with an external force. It is possible to desorb removables constituting a cause of clogging or forming gaps, and provide passages for fluids.

The first filter can be made of a polyolefin high polymer. The first filter can have resistance to alkalis and acids, and therefore, even fluids with mixed chemicals can be filtered. Also, coagulating sedimentation is possible with the first filter still immersed.

The removables can be inorganic solids or organic solids.

Furthermore, to solve problems of the conventional art, a solid cake is collected and recycled.

The solid cake can be collectively provided for recycling enterprises (semiconductor wafer makers, Si material suppliers, filler machining makers, solar battery makers, and cement and concrete and resin makers). Material containing a poisonous substance, such as arsenic, can be collected while it is stabilized using Si and is in a dumping state rather than dry, which will prevent, to the extent possible, the environmental dispersion of the material.

A first aspect of the method is a method of fabricating a semiconductor device, which comprises the steps of:

removing a processing waste in a fluid by passing through a filter comprising at least a part of a processing waste generated in a step of processing a semiconductor using the fluid.

A second aspect of the method is a method of fabricating a semiconductor device according to the first aspect, wherein the step of processing a semiconductor comprises a step of mechanical processing a semiconductor using the fluid.

A third aspect of the method is a method of fabricating a semiconductor device according to the second aspect, wherein the step of mechanical processing a semiconductor comprises a polishing step or grinding step using the fluid.

A fourth aspect of the method is a method of fabricating a semiconductor device according to the first aspect, further comprising the steps of:

preparing a filter by passing the fluid including removables thorough a first filter and depositing the removables on the first filter surface so as to form a second filter; and filtering the removables by passing the fluid through the filter and thereby removing the removables from the fluid.

A fifth aspect of the method is a method of fabricating a semiconductor device according to the fourth aspect, wherein the step of preparing a filter comprises the steps of:

passing the fluid including removables thorough the first filter and depositing the removables on the first filter surface so as to form a second filter while circulating.

A sixth aspect of the method is a method of fabricating a semiconductor device according to the first aspect, wherein the step of processing a semiconductor comprises a step of dicing.

A seventh aspect of the method is a method of fabricating a semiconductor device according to the first aspect, wherein the step of processing a semiconductor comprises a step of mirror polishing.

An eighth aspect of the method is a method of fabricating a semiconductor device according to the first aspect, wherein the step of processing a semiconductor comprises a step of back grinding.

A ninth aspect of the method is a method of fabricating a semiconductor device according to the first aspect, wherein the second filter comprises processing waste of different sizes.

A tenth aspect of the method is a method of fabricating a semiconductor device according to the first aspect, wherein the processing waste comprise different sizes particles, and said second filter is made up of pores which are larger than the smallest sizes of the particles and larger than the largest sizes of the particles.

An eleventh aspect of the method is a method of fabricating a semiconductor device according to the first aspect, wherein said step of removing comprises a step of circulating the fluid for a constant time since starting removing.

A twelfth aspect of the method is a method of fabricating a semiconductor device according to the eleventh aspect, wherein said step of circulating comprises a step of detecting an inclusion degree of processing waste included in the fluid passing through the filter, and stopping circulation of the fluid at the time point when the detected degree has fallen below a constant value.

A thirteenth aspect of the method is a method of fabricating a semiconductor device according to the twelfth aspect, wherein said step of circulating comprises a step of detecting an inclusion degree of removables included in the fluid passing through the filter, and starting circulation of the fluid again at the time point when the detected degree has exceeded above a second constant value.

A fourteenth aspect of the method is a method of fabricating a semiconductor device according to the fourth aspect, wherein said step of filtering comprises a step of filtering the fluid while sucking through the filter.

A fifteenth aspect of the method is a method of fabricating a semiconductor device according to the fourth aspect, further comprising a step of applying an external force to a surface of the filter so that a constituent of the second filter can be moved.

A sixteenth aspect of the method is a method of fabricating a semiconductor device according to the fifteenth aspect, wherein said step of applying an external force comprises a step of applying the external force intermittently.

A seventeenth aspect of the method is a method of fabricating a semiconductor device according to the fifteenth aspect, wherein said step of applying an external force comprises a step of applying gas flow along a surface of the first filter.

An eighteenth aspect of the method is a method of fabricating a semiconductor device according to the fifteenth aspect, wherein said step of applying an external force comprises a step of applying a force so as to make a part of the constituent of the second filter released.

A nineteenth aspect of the method is a method of fabricating a semiconductor device according to the fifteenth aspect, wherein said step of applying an external force comprises a step of controlling a force so that a thickness of the second filter is constant.

A twentieth aspect of the method is a method of fabricating a semiconductor device according to the fifteenth aspect, wherein said filter is disposed in perpendicular direction and said external force comprises a raising force of a bubble.

A twenty-first aspect of the method is a method of fabricating a semiconductor device according to the fifteenth aspect, wherein said step of applying an external force comprises a step of applying a mechanical vibration.

A twenty-second aspect of the method is a method of fabricating a semiconductor device according to the fifteenth aspect, wherein said step of applying an external force comprises a step of generating a sonic wave.

A twenty-third aspect of the method is a method of fabricating a semiconductor device according to the fifteenth aspect, wherein said step of applying an external force comprises a step of generating a flow of the fluid.

A twenty-fourth aspect of the method is a method of fabricating a semiconductor device according to the first aspect, wherein said first filter is made of polyolefin high polymer.

A twenty-fifth aspect of the method is a method of fabricating a semiconductor device according to the first aspect, wherein said first filter has an uneven surface.

A twenty sixth aspect of the method is a method of fabricating a semiconductor device according to the fourth aspect, wherein said first filter has a bag typed filter in which clearance is formed and in which suction pipe for sucking is inserted.

A twenty-seventh aspect of the method is a method of fabricating a semiconductor device according to the fourth aspect, wherein said second filter comprises Si.

A twenty-eighth aspect of the method is a method of fabricating a semiconductor device according to the fourth aspect, wherein said second filter comprises mainly flake type of Si.

A twenty-ninth aspect of the method is a method of fabricating a semiconductor device according to the first aspect, wherein said processing waste comprises a processing agent used for mechanical processing.

A thirtieth aspect of the method is a method of fabricating a semiconductor device according to the first aspect, wherein said fluid is reused after removing the processing waste.

Removables may comprise many kinds of form, such as flake typed Si. Hence, a good filter can be obtained without blocking.

If the removables are solids, small gaps of various shapes can be formed by the particles of differing diameter sizes. Consequently, smaller removables can be trapped and also more passages for fluid can be provided.

BRIEF DESCRIPTION OF THE DRAWINGS

FIG. 12 shows data for comparing an exemplary filtering system of the invention with a conventional apparatus.

FIGS. 17A to 17F are diagrams for explaining a filtering system installed in a transferring apparatus;

DETAILED DESCRIPTION OF THE PREFERRED EMBODIMENTS

This invention can remove removables (waste matter) from wastewater in a step of manufacturing a semiconductor device with a filter made of removables. The wastewater can contain mixed metal, inorganic or organic removables. Removables are produced when slicing a crystal ingot into wafer form, when dicing, when back-grinding, when performing CMP (Chemical-Mechanical Polishing) or polishing a semiconductor wafer.

Examples of removables are Si, Si oxide, Al, SiGe, organics such as sealing resin, and other insulating materials and metal materials. GaAs in compound semiconductors, would also be included.

Recently, dicing technique has been employed with CSP (Chip Scale Package) manufacture. In dicing the surface of a wafer is coated with a resin and the sealed resin and wafer are diced together. Also, semiconductor chips are placed in the form of a matrix on a ceramic substrate, covered with a resin including the ceramic substrate, and the sealed resin and ceramic substrate are diced. Removables arise during those dicing processes.

Removables are also produced outside the semiconductor field. For example, in industries using glass such as liquid crystal panels, panels of EL display devices and so on, glass waste as removables is produced when glass substrates are diced or substrate side faces are ground. Electric power companies and steel companies use coal as fuel. Fine particles arising from coal constitute removables, and fine particles mixed with smoke emerging from chimneys constitute removables. The same goes for fine particles arising from the processing of ores, the processing of precious stones, and the processing of gravestones. Also, metal waste produced when working with a lathe or the like, and ceramic waste produced during dicing and polishing ceramic substrates and the like also constitute removables.

Removables arise when substances are polished, ground or milled, and a fluid such as water or a chemical is supplied to remove the removables. Consequently removables are mixed into this fluid.

The invention will be explained with reference to FIG. 1 through FIG. 3. Removables can be various things, but the description below will assume that an exemplary fluid is water and that removables from cutting, grinding, polishing, and milling processes are included in the water.

Figure 1:
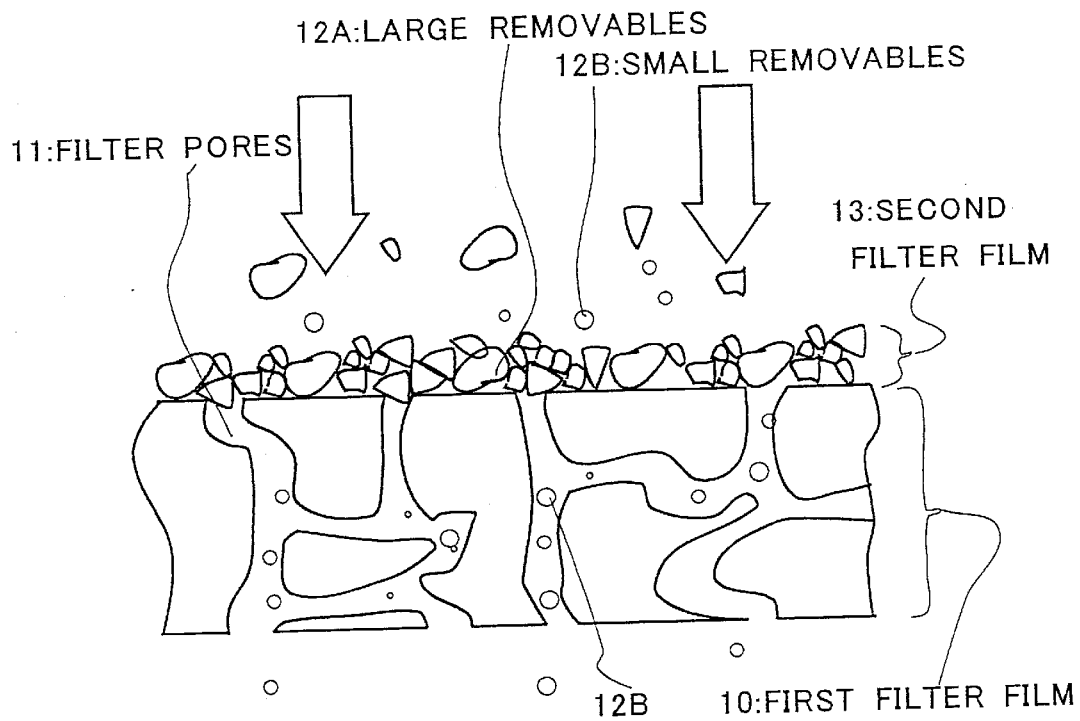
FIG. 1 shows a filter film of an embodiment of the invention.

FIG. 1 shows a first filter film 10 and a filter pore 11. Films formed in layers on exposed parts of the filter pores 11 and the surface of the first filter film 10 are removables 12. The removables 12 are divided into large removables 12A and small removables 12B, which can pass through the filter pores 11. Circled black dots represent the small removables 12B.

Filter films usable in principle are either organic high polymers such as a polyolefin high polymer film or ceramics. Examples below use polyolefin high polymers as filters.

Figure 7:
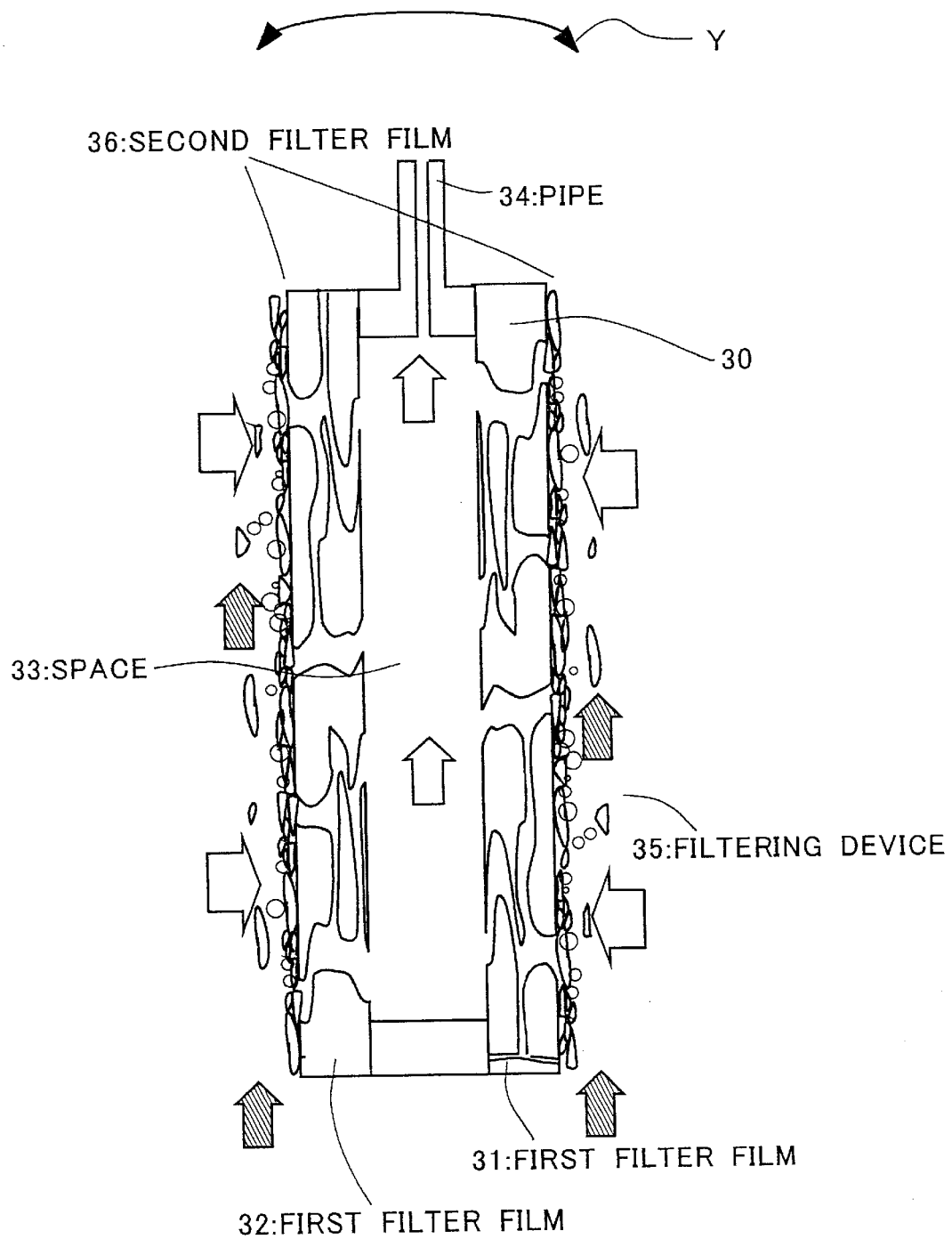
FIG. 7 shows an exemplary filtering operation of FIG. 5 and FIG. 6.

Wastewater containing mixed removables is located above the first filter film 10 of FIG. 1, and filtered water filtered by the first filter film 10 is located below the first filter film 10. Because wastewater is made to flow in the direction of the arrows, and the wastewater is filtered using the filter film 10, the water would descend naturally, but it can be pressurized or made to move downward in the figure. The wastewater is sucked from the side where the filtered water is. Although the first filter film 10 is disposed horizontally, it may alternatively be disposed vertically as shown in FIG. 7.

As a result of the wastewater being pressurized or sucked through the filter film as described above, the wastewater passes through the first filter film 10. The large removables 12A, which cannot pass through the filter pores 11, remain on the surface of the first filter film 10.

A layer resulting from removables being trapped and remaining on the surface of the first filter film 10 is utilized as a second filter film 13.

Removables arising from machining work such as grinding, polishing or milling are distributed in size (particle diameter) over a certain range, and furthermore the shapes of individual removables are different. Removables are suspended randomly in the wastewater in which the first filter film 10 is immersed. Large removables and small removables move toward the filter pores 11 in a random fashion. Initially, the removables 12B smaller than the filter pores 11 pass through, but the removables 12A larger than the filter pores 11 are trapped. The large removables 12A on the surface form a first layer of a second filter film 13, and this layer forms filter pores smaller than the filter pores 11, and removables ranging from the large removables 12A to the small removables 12B are trapped by these smaller filter pores. Because the shapes of the individual removables are different, gaps of various shapes form between the deposited removables, and water moves through those gap passages and is filtered.

The second filter film 13 gradually grows as it randomly catches large removables 12A to small removables 12B, and starts to trap small removables 12B while providing passages for water (fluid). Furthermore, because the removables of the second filter film 13 just remain on the layers and are easily movable, surface layers of the second filter film 13 can be simply resuspended to the wastewater side by passing bubbles through the vicinities of the layers, applying a water flow, applying sound or ultrasonic wave, applying a mechanical vibration, or rubbing with a squeegee, for example. That is, even when the filtering capacity of the second filter film 13 drops, the capacity can be restored simply by applying an external force to the second filter film 13. The filtering capacity is degraded mainly by clogging, and the removables responsible for clogging on the surface layer of the second filter film 13 can be easily resuspended back into the fluid, and the clogging can be ameliorated.

However, when the first filter film 10 is newly installed, because no layer of removables 12 (second filter film 13) is formed on the surface of the first filter film 10, or when the second filter film 13 layer has formed only a thin layer on the first filter film 10, the small removables 12B pass through the filter pores 11. The filtered water is recirculated to the side where the wastewater is stored and monitored to confirm that the small removables 12B are being trapped by the second filter film 13. Through such process, small-size removables like the small removables 12B passing through the filters are gradually trapped, and the wastewater is filtered to a predetermined cleanliness.

Figure 8:
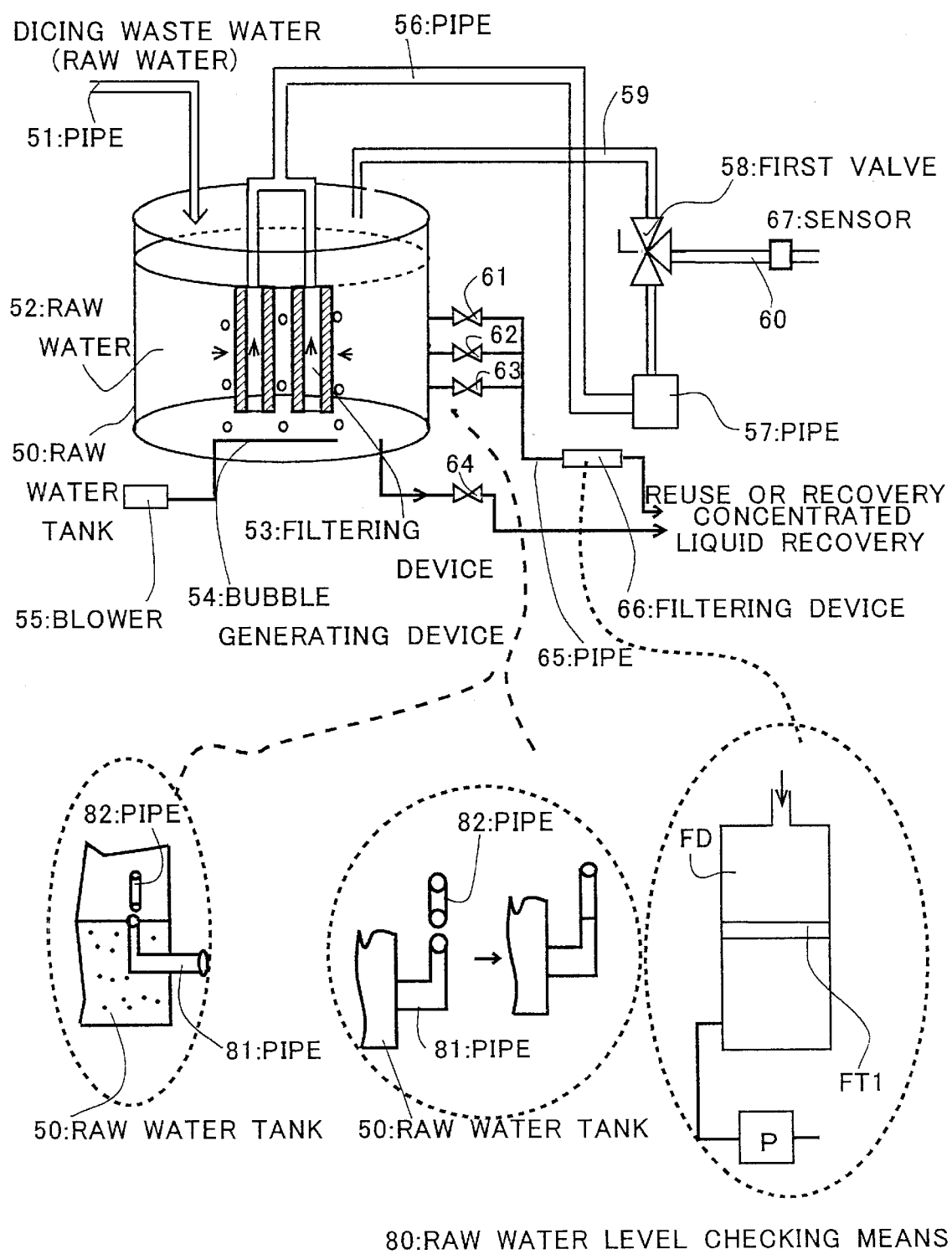
FIG. 8 shows a system view illustrating an exemplary filtering method of the invention.

The above-mentioned confirmation can be faciliated if a detecting means like a light sensor 67 shown in FIG. 8 is provided so that the concentration of the removables can be sensed.

When the second filter film 13 has not formed or when the small removables 12B remain in the filtered water, the filtered water is returned to the wastewater side. During recirculation, the removables 12 trapped by the filter pores 11 grow in layer to form a film, and the second filter film 13 on the surface of the first filter film 10 provides various filter pore diameters and gradually traps removables of small particle diameters to large particle diameters. The film gradually becomes thicker and traps the small removables 12B having passed through the first filter film 10 and other removables of about the same size as and also smaller than the small removables 12B, and the filtered water becomes clean with almost no removables mixed it.

Figure 2:
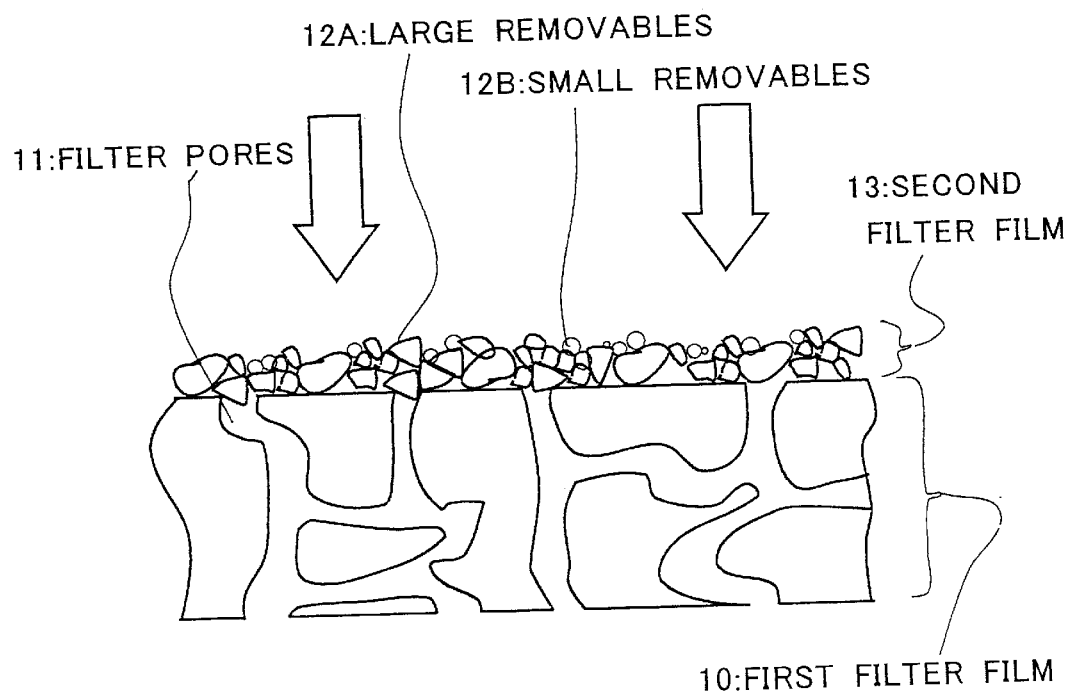
FIG. 2 shows a filter film of an embodiment of the invention.

FIG. 2 shows a state where small removables 12B are trapped. After the confirmation that removables of a desired size are not mixed in with the filtered water (that they have become smaller than the predetermined concentration), the filtered water can be reused. Alternatively, the filtered water may be returned to nature.

When the small removables 12B remain in the filtered water, this filtered water may not be returned, but may be moved to another tank. After it is confirmed that those small removables 12B and removables of about the same size as those small removables 12B are trapped, the filtered water may be reused or returned to nature.

The wastewater stored above the second filter film 13 is gradually concentrated.

Figure 3:
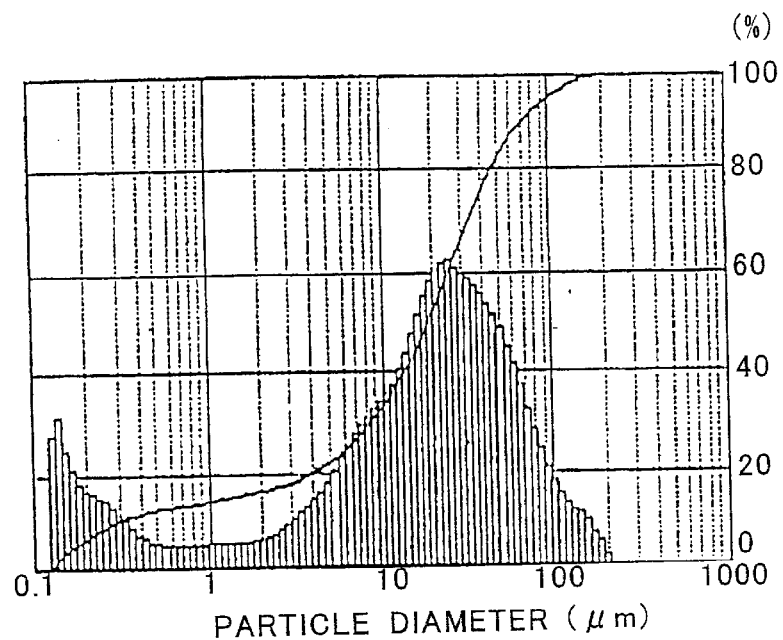
FIG. 3 shows a particle diameter distribution of silicon waste in wastewater produced during dicing.

FIG. 3 shows a particle diameter distribution of waste arising during dicing of a Si wafer. It is distributed over a range of about 0.1 $\mu$m to 200 $\mu$m.

Because the particle diameter distribution measuring device could not detect particles smaller than 0.1 $\mu$m, the distribution of waste smaller than 0.1 $\mu$m is not shown. In practice, particles smaller than this exist and are filtered effectively. In experiments, it was found that when wastewater containing waste is filtered, the waste formed on the first filter film and trapped waste of below 0.1 $\mu$m.

For example if waste smaller than 0.1 $\mu$m are to be extracted, it is normal to employ a filter formed with pores smaller than this size. However, even if filter pores of a size between a peak distribution of large particle diameters and a peak distribution of small particle diameters are used, waste of below 0.1 $\mu$m can still be trapped.

Conversely, if there was a single peak of particle diameter of the removables at 0.1 $\mu$m, the filter would probably be clogged quickly. As can be seen from FIG. 3, two peaks—a large particle diameter and a small particle diameter—appear, and as a result of this the filtering capacity is increased. When observed with an electron microscope, it is found that the shapes of the cutting waste are diverse. Evidently, because there are at least two particle diameter peaks and the shapes of the cutting waste are diverse, various gaps form between waste particles to provide passages for filtered water, and consequently there is little clogging and a filter with a large filtering capacity is realized.

A filter of average pore diameter 0.25 $\mu$m was used as the first filter film 10. However if the distribution appears to shift to the right or to the left to the one shown in FIG. 3, the pore diameter of the filter may be changed according to that distribution. For example, if it appears to shift to the right, a pore diameter larger than 0.25 $\mu$m may be employed. Generally, if the pore diameter is increased, the number of removables passing through the filter film increases, but if the time for which filtered water is returned to the wastewater is extended, almost all can be trapped by the second filter film 13. Naturally, if the pore diameter of the filter is made smaller, the time needed to filter small removables becomes shorter.

Figure 4:
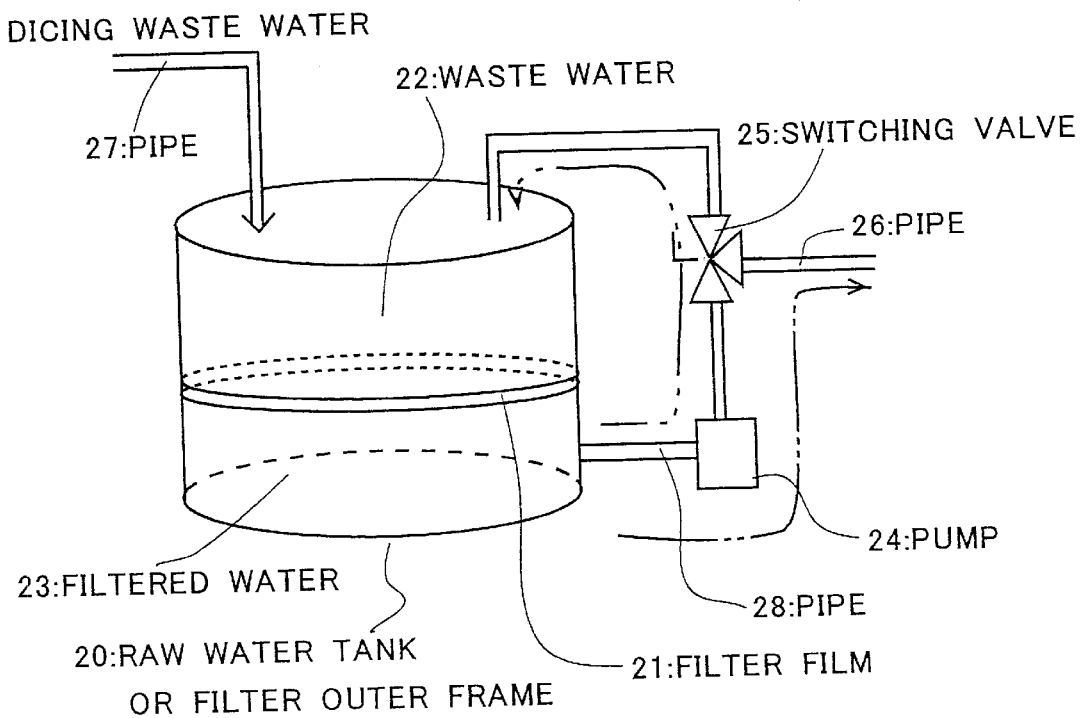
FIG. 4 shows an exemplary filtering method of the invention.

FIG. 4 is an exemplary schematic of filtered water being returned to the wastewater side. FIG. 4 shows a raw water tank 20 or means (outer frame) for fixing the filters and a filter film 21.

The tank 20 (reservoir vessel) stores wastewater 22 above the filter film 21, and stores filtered water 23 below the filter film 21. The filtered water 23 is transported to various places by a pump 24 and directed by a switching valve 25. Because there are removables passing through the filter film 21, the valve 25 is switched so that filtered water is returned to the tank 20. The filtered water is checked, and when the concentration of removables reaches a desired value, or when removables are virtually all removed, the valve 25 is switched and filtered water is made to flow to the pipe 26. The resultant filtered water flowing to the pipe 26 is a water free from removables or a filtered water of a desired concentration that can be reused. It can also be returned to nature as clean water. Filtered wastewater used for dicing can be used for dicing again. It can also be reused as water for washing solder or back-grinding, or cooling water.

In FIG. 4, suction was employed as a method for passing wastewater through the filter but there are other methods such as gravity flow method and pressure method from the wastewater 22 side. Suction or pressurization technique can increase the filtering capacity.

The tank 20 is attached to pipes 27 and 28 and is sealed together. Filtration becomes possible if the pipe 27 side is pressurized or suction is applied with the pump 24. In this example filter device is disposed in a path through which water passes.

FIG. 5 through FIG. 8 illustrate a filtering device 35, which is placed or immersed in a raw water tank 50.

Figure 5A:
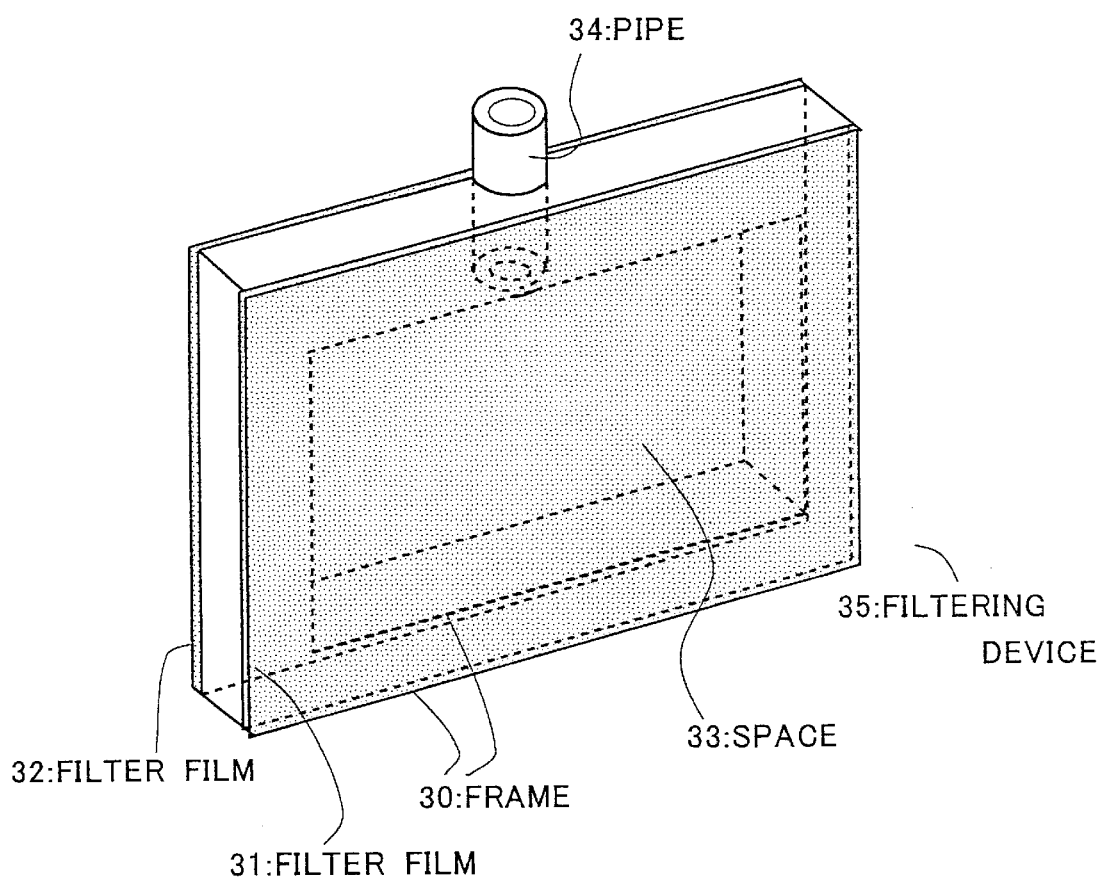
FIG. 5 shows an exemplary filtering device used in the invention.

FIG. 5a shows a frame 30 shaped like a picture frame, and filter films 31 and 32 fixed in place to face each other. Filtered water fills an inside space 33, enclosed by the frame 30 and the filter films 31 and 32, and transported through a pipe 34 which sucks the filtered water in. Filtered water is taken out through the pipe 34 attached and sealed to the frame 30. The filter films 31 and 32 and the frame 30 are completely sealed so that the wastewater does not enter the space 33 except through the filter films.

Figure 5B:
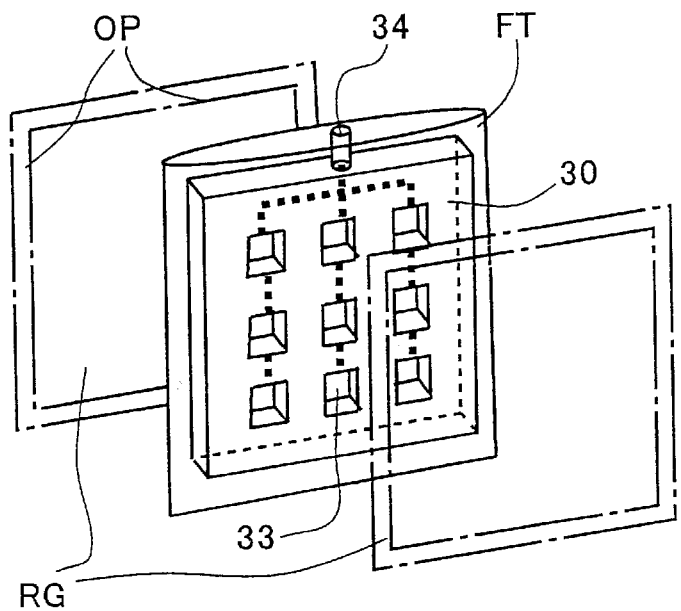

When the wastewater is sucked in, sometimes the filter film 31 of FIG. 5a, a thin resin film, is distorted to the inner side and breaks. Consequently, to make this space as small as possible and make the filtering capacity large, multiple inner spaces can be formed. This is shown in FIG. 5b. In FIG. 5b, only nine spaces 33 are shown, but many more can be formed. The filter films 31 and 32 are made from a polyolefin high polymer film of thickness about 0.1 mm and in FIG. 5b, they are formed into a bag shape as FT. A frame 30 with a pipe 34 is inserted into this bag-shaped filter FT, and the frame 30 and the filter FT are in a face-to-face position. Two pressing means RG press the frame from both sides to keep the FT fixed to the Frame. The FT is exposed through openings OP in the pressing means RG. The details will be described with FIG. 6.

Figure 5C:
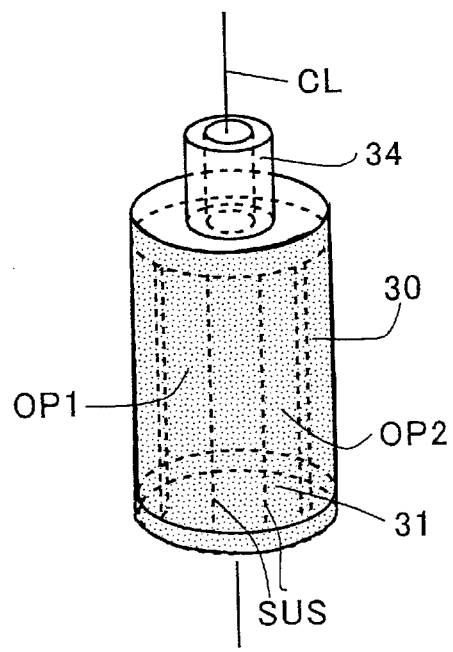

FIG. 5C shows a cylindrical filtering device 35. A frame attached to a pipe 34 is cylindrical, and openings OP1 and OP2 are provided in the side face of the frame. Because the side face corresponding to the openings OP1 and OP2 is removed, supporting means SUS for supporting the filter film 31 are provided between the openings. A filter film is fitted to the side face.

The filtering device 35 will be described further in detail with FIG. 6. A part 30a corresponding to the frame 30 of FIG. 5(b) will be described with FIG. 6b.

The part 30a is in a shape that looks like a corrugated cardboard. Thin resin sheets SHT1 and SHT2 (0.2 mm each) are superposed; between them multiple sections SC are provided in the vertical direction; and spaces 33 are formed enclosed by the resin sheets SHT1 and SHT2 and the sections SC. The cross-section of the spaces 33 is a rectangle of length 3 mm and width 4 mm. It is shaped as if many straws having this rectangular cross-section have been lined up and integrated. The symbol 30a, because it keeps the filter films FT of both sides at a fixed spacing, is called a spacer.

In the surfaces of the thin resin sheets SHT1 and SHT2 of this spacer 30a, many holes HL of diameter 1 mm are opened, and the filter films FT are fitted to those surfaces. Filtered water filtered by the filter films FT passes through the holes HL and the spaces 33 and leaves through the pipe 34.

The filter films FT are fitted to the resin sheets SHT1 and SHT2 of the spacer 30a. In the resin sheets SHT1 and SHT2 of the spacer 30a there are parts where holes HL are not formed. There is no filtering function on the filter film FT corresponding to the parts where holes HL are not formed because wastewater does not pass through and parts where removables are not trapped arise. To prevent this phenomenon, a plurality of filter films FT are fitted. An outermost filter film FT1 is a filter film for catching removables, and toward the surface SHT1 of the spacer 30a, a plurality of filter films having larger pores than the pores of the filter film FT1 are provided. In FIG. 6, an inner filter film FT2 is provided next to the filter film FT1. Even at parts of the spacer 30a where holes HL are not formed, because the filter film FT2 has large pores than those of the FT1, the entire face of the filter film FT1 has a filtering function, and removables are trapped on the entire face of the filter film FT1. The second filter film is formed by those removables over the entire front and rear faces of SHT1 and SHT2. Although the filter sheets SHT1 and SHT2 are shown like rectangular sheets in FIG. 6b, they may be formed as bags as shown in FIG. 5b.

Figure 6A:
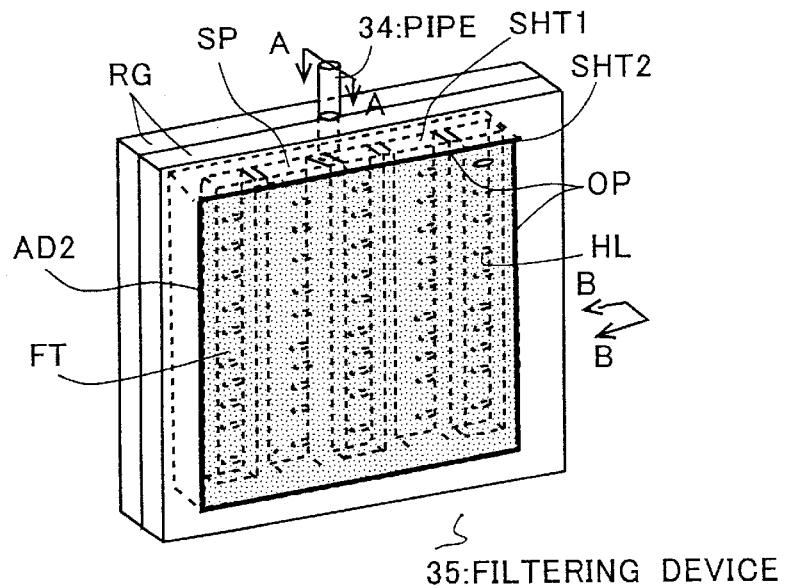
FIG. 6 shows an exemplary filtering device used in the invention.
Figure 6B:
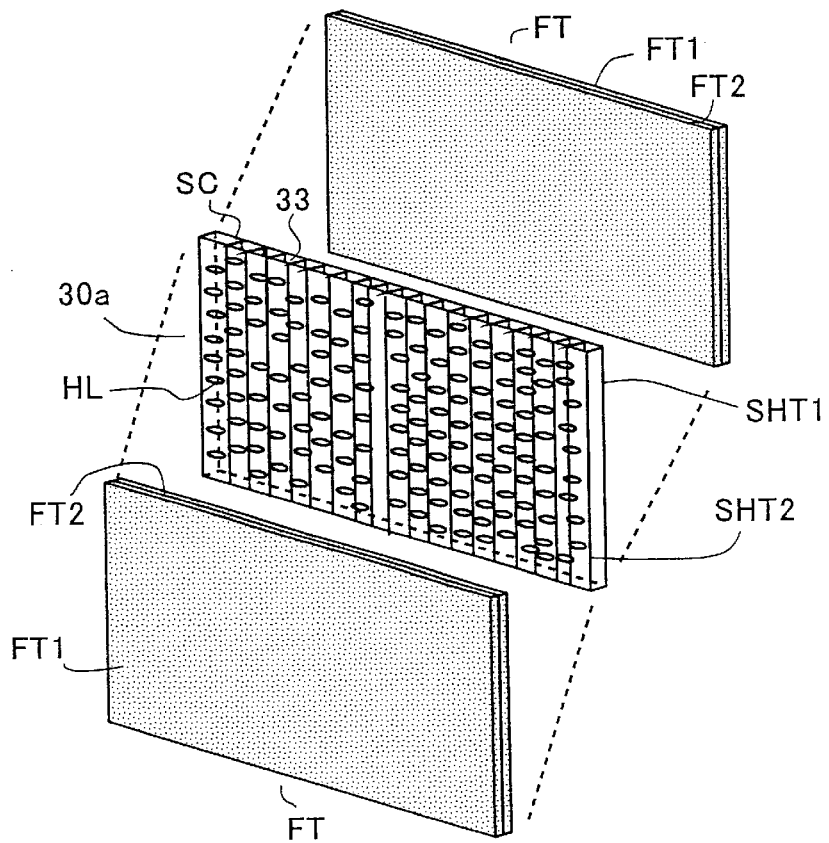
Figure 6C:
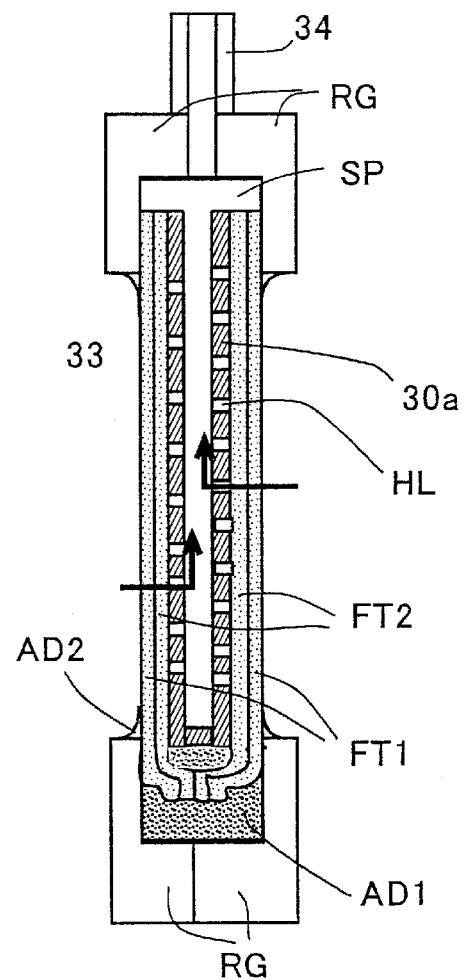
Figure 6D:
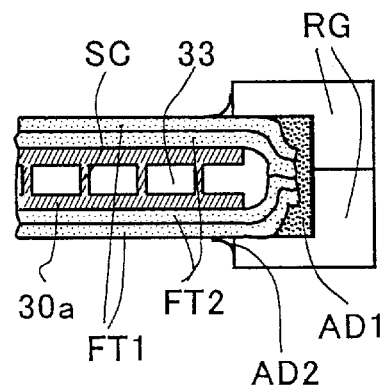

FIG. 6a, FIG. 6c, and FIG. 6d show how the baglike resin sheets SHT1 and SHT2, the spacer 30a and the pressing means RG are installed.

FIG. 6a shows a perspective view of an exemplary filtering device 35, FIG. 6c shows a cut view from the head of the pipe 34 in the direction of the extension of the pipe 34 (the vertical direction), as shown by the A—A line of FIG. 6a, and FIG. 6d shows a sectional view of the filtering device 35 cut in the horizontal direction.

In FIG. 6c and FIG. 6d, the spacer 30a is inserted into the bag-shaped filter FT of FIG. 5b, and the four sides including the filter FT are sandwiched by the pressing means RG. The three sides closed in bag form and the remaining one side are fixed with an adhesive AD1 coated on the pressing means RG. Between the remaining one side (the open part of the bag) and the pressing means RG, a space SP is formed, and filtered water produced in the spaces 33 is sucked into a pipe 34 through the space SP. In the openings OP of the pressing means RG, an adhesive AD2 is provided all the way around, and they are completely sealed, so that fluid cannot enter except through the filter.

The spaces 33 and the pipe 34 are connected, and when the pipe 34 is sucked, fluid passes through the pores in the filter films FT (FT1 and FT2) and the holes HL in the spacer 30a toward the spaces 33, and the filtered water can be transported from the spaces 33 via the pipe 34 to the outside. The sheets SHT constituting the spacer 30a, support the filter films FT because areas other than where the holes HL are formed are made flat. Therefore, the filter films FT can maintain flat faces at all times, which help prevent breakage of the second filter film.

The operation of the filtering device 35 is shown schematically in FIG. 7. If the pipe 34 is sucked with a pump in the direction as shown by the arrows without hatching, wastewater flows in through the filters and is filtered.

A second filter film 36 is formed on the vertically disposed filtration device by layers of removables trapped by the first filter films 31 and 32. Because the second filter film 36 consists of solid removables which have aggregated, by applying an external force to the second filter film 36, it is possible to remove the second filter film 36 entirely, or remove a surface layer of the second filter film 36. Removal can be realized simply by the ascending force of bubbles, a water flow, sound, ultrasound vibration, mechanical vibration, rubbing of the surface with a squeegee, or an agitator or their equivalents. And the immersed filtering device 35 itself may be made to move in the wastewater (raw water), and a water flow thereby produced on a surface layer of the second filter film 36 can remove the second filter film 36. For example, in FIG. 7, the filtering device 35 may be moved to the left and right as shown by the arrows Y about its base face as a support point. Because the filtering device itself moves, a flow can be created, and a surface layer of the second filter film 36 can be removed. If a bubble generating device 54 to be discussed in detail later is used for the above-mentioned movable structure as well, bubbles can be made to strike the entire filtration faces, and removed matter can be resuspended into the wastewater efficiently.

If the cylindrical filtering device shown in FIG. 5C is employed, the filtering device itself can be rotated about the centerline CL as an axis, and the resistance of wastewater can be reduced. As a result of the rotation, a water flow arises on the filter film surface, and removables of the second filter film surface layer can be transferred back into the wastewater, and the filtering capacity can be maintained.

In FIG. 7, as the method for removing the second filter film, an example wherein the ascending of bubbles is utilized is shown. Bubbles ascend in the direction of the arrows shown with hatching, and the ascending force of those bubbles and bursting of bubbles apply an external force directly to the removables. Also, water flow resulting from the ascending force of bubbles and bursting of bubbles applies an external force to the removables. And as a result of this external force, the filtering capacity of the second filter film 36 is constantly refreshed, and a substantially constant filtering capacity is maintained.

Another embodiment of the invention is related to the maintenance of filtering capacity. Even if clogging occurs in the second filter film 36 and its filtering capacity falls, by applying an external force like the bubbles described above, removables constituting the second filter film 36 can be transferred into the wastewater, thereby maintaining the filtering capacity over a long period.

Depending on the way the external force is applied, there are two methods of filtration. One is a method wherein the second filter film 36 is completely removed. In this case, small removables pass through the filter film because there are no removables layered on the first filter film. Until it is confirmed that small removables are being trapped, the filtered water is recirculated to the water vessel (tank) containing the wastewater (raw water). Alternatively, though less efficient, filtered water containing small removables can be moved to another water vessel until small removables are trapped on the film.

The second is a method wherein a film (removables which are the cause of clogging) formed on the extreme surface of the second filter film 31 and 32 is moved. Because removables causing clogging are mostly on the extreme surface of the filter film, by releasing them by an external force produced by means of, for example, bubbles, a constant filtering capacity can be maintained at all times. This can be thought of as keeping the thickness of the second filter substantially constant by applying an external force. It is a repitive cycle of removables plugging the gaps and pores, external force agitating the extreme layer to unplug and open the gaps and pores, wastewater entering through the opened gaps and pores, and removables plugging the gaps and pores again. The filtering capacity can be maintained at all times by adjusting the size of the bubbles, their amount, and the duration of the application of the bubbles.

To maintain the filtering capacity, the external force may be applied constantly or intermittently.

It is prefer that the filter film be completely immersed in the raw wastewater. If the second filter film is in contact with air for a long time, the film may dry and flake or crumble. Even if it has just a small location exposed to the atmosphere, the filter film will take in air and reduce the filtering capacity.

As long as the second filter film 36 can form on the first filter films 31 and 32, the first filter films 31 and 32 may be made of sheet-form high polymer or ceramic and may be of the suction type or the pressurized type. However, the first filter films 31 and 32 are preferably high polymer films and of the suction type.

The cost to make a sheet-form ceramic filter is high. If cracks form, leaks occur and filtering becomes impossible. For the pressurized type, the wastewater must be pressurized. For example, the top of the tank 50 in FIG. 8 must not be an open type but a closed type to apply pressure. However, it is difficult to produce bubbles in a closed type. On the other hand, a high polymer film can be molded into various sheets and bag-form filters. Since they are flexible, cracks do not form and forming concavities and convexities in sheets are easy. As a result of forming concavities and convexities, the second filter film lodges onto the sheet, and flaking off into the wastewater can be suppressed. Furthermore if it is suction type, the tank can be an open type.

The pressurized type makes the formation of the second filter film difficult. In FIG. 7, if the pressure inside the spaces 33 is 1, a pressure of more than 1 must be applied to the wastewater. Consequently, a load acts on the filter film, and also lodged removables are fixed by high pressure, and removables would probably not be dislodged easily.

A suction type mechanism in which a high polymer film is employed as a filter film is shown in FIG. 8.

FIG. 8 shows a raw water tank 50. Above the tank 50, a pipe 51 is provided as a means to supply raw water. The pipe 51 passes fluid containing removables. For example, the pipe 50 may carry wastewater (raw water) containing removables out from a dicing apparatus, a back-grinding apparatus, a mirror polishing apparatus or a CMP apparatus used in manufacturing semiconductors. In the following example, wastewater will be assumed to contain silicon waste produced from a dicing machine.

In raw water 52 stored in the tank 50, a plurality of filtering devices 53 are immersed. Under these filtering devices 53, a bubble generating device 54 is provided, and its position is adjusted so that bubbles pass over the surface of the filter films. An air blower 55 is attached to the bubble generating device 54.

A pipe 56 fixed to the filtering devices 53 corresponds to the pipe 34 of FIG. 5 through FIG. 7. Filtered water filtered by the filtering devices 53 passes through this pipe 56 and is selectively transported through a first valve 58 to a pipe 59 on the tank 50 side and a pipe 60 on a reuse (or draining) side A second valve 61, a third valve 62, a fourth valve 63 and a fifth valve 64 are attached to the side wall or the bottom of the tank 50. And attached to the end of a pipe 65 is a separately provided filtering device 66.

The raw water 52 supplied through the second valve 61 is stored in the tank 50 and filtered by the filtering devices 53.

Bubbles pass through the surfaces of filter films fitted to the filtering devices, and ascending force and bursting of the bubbles move silicon waste trapped on the filter films. The bubbles are applied constantly to maintain the filtering capacity.

When the filter films are newly fitted, or when it has been stopped for a long time because of a holiday, or when silicon waste is mixed in the pipe 56, the first valve 58 is used to recirculate the filtered water through the pipe 59 to the tank 50. Otherwise, the first valve 58 is switched to the pipe 60 and the filtered water is reused.

When the filter films are newly fitted, the recirculation time differs according to the size of the filter films, the amount of the silicon waste, and the suction speed. However, second filter films can form on the surfaces of the filter films in 4 to 5 hours. The formed second filter films are able to catch silicon waste of below 0.1 μm in size. However, if the size of the filter films is small, approximately 30 minutes is enough to form the second filter film. Accordingly, if the recirculation time is known, a timer may be set and the first valve 58 may be automatically switched when a predetermined time has elapsed.

The frame (for example, a pressing means RG) of FIG. 6 in which the filter films are mounted has the dimension of about 100 cm in height, about 50 cm in width, and about 5 to 10 mm in thickness. A plurality of filtering devices 35 with approximately 0.1 mm thick filter films are installed on both faces of the spacer 30*a*.

When the removables are higher than a predetermined concentration, the filtered water is determined to be irregular, and recirculation is automatically started or a pump is stopped and filtering is stopped. During recirculation, since there is a risk of wastewater overflowing from the tank 50, fluid supply from the pipe 51 to the tank 50 may be stopped.

[1] In the case that filter films are newly installed to a frame (spacer).

Initially, when second filter films have not yet formed, the filtering capacity is low. The wastewater is recirculated to form the second filter films with removables trapped on the filter films. The second filter films are grown to a state (below a first predetermined value) such that a target particle diameter is trapped by the second filter films, and after the formation of the second filter films, the first valve 58 is switched and filtered water is fed to the pipe 60 and the filtration is started.

[2] In the case that filtering is stopped for holidays, long vacations, maintenance and the like and filtering is restarted.

Because the second filter films are made from removables and are in wastewater, when filtering is stopped for a long time, the films crumble. Recirculation restores the state of the second filter films. Filtered water is recirculated until the concentration of the removables falls below the first predetermined value, and thereafter the first valve 58 is switched and filtration is started. Bubbles are generated at least when filtration is started.

[3] In the case that trapped removables are mixed back into wastewater.

When the second filter films partly crumble, or when the second filter films are disrupted, removables mix back into the filtered water.

When the second filter films have partly crumbled and the concentration of the removables has become higher than a predetermined value (second predetermined value), recirculation is started to restore the second filter films. When the removables in the filtered water reaches a predetermined concentration (first predetermined value) the first valve 58 is switched and filtered water is fed to the pipe 60 and filtration is started. Bubbles are generated at least from the time filtration is started.

When the filter films are broken, it may become necessary to stop the pump 57 and replace the filter films or replace the filtering devices 53 themselves. When the filter films are new, wastewater is recirculated as in [1]. Filtering devices whose filter films are not broken and have second filter films formed on their surfaces may be separately prepared and substituted. The second filter films may trap removables to the first predetermined value, and when they cannot, recirculation is carried out. If they can, the first valve 58 is switched and filtered water is fed to the pipe 60 and filtration is started.

[4] In the case that the level of the wastewater in the tank 50 falls and the filter films contact the atmosphere. Before the filter films contact the atmosphere, the pump is stopped and filtering is stopped on the basis of a level indicated by a sensor provided in the wastewater. Furthermore, bubbles may be stopped. Although wastewater is supplied through the pipe 51 and the level of the wastewater rises, because there is a risk of the second filter films crumbling under turbulence caused by the wastewater, the pump is stopped. And when the filtering devices 53 is completely immersed in the waste water, the pump is started. During recirculation, removables are detected, and when the removables in the filtered water have reached a predetermined concentration (first predetermined value), the first valve 58 is switched and filtered water is fed to the pipe 60.

The first predetermined value and the second predetermined value indicating the concentration of removables in the filtered water may be the same, or the second predetermined value may deviate a certain amount from the first predetermined value.

A sensor 67 constantly senses silicon waste. The sensor 67 can be a light sensor with light-receiving/light-emitting devices. The light-emitting device may be a light-emitting diode or a laser. The sensor 67 may be attached partway along the pipe 56 or partway along the pipe 59.

With time, the raw water becomes concentrated. And when it has reached a predetermined concentration, filtration is stopped, and using PAC, or $Al_2(SO_4)_3$ or the like, the raw water is made to undergo coagulating sedimentation and left to stand. When this is done, the raw water in the tank generally divides into layers. Going from the upper layers to lower layers, the raw water is almost clear to completely opaque due to removables. The raw water is collected by a selective use of the valves 61 through 64.

For example, the almost clear raw water containing little silicon waste is collected through the filtering device 66 by opening the second valve 61. Then the valves 62 and 63 are successively opened and raw water is collected. Concentrated slurry settling at the bottom of the raw water tank is collected by opening the valve 64.

If the fifth valve 64 is opened first, concentrated slurry flows under the weight of the raw water, and water above the slurry also flows out, making the controlled collection of water difficult. For this reason, the valves are opened in the order 61, 62, 63, and 64 to collect the raw water in a controlled manner.

In the lower middle of FIG. 8 (drawing surrounded by a dotted line) a raw water level checking means 80 of the raw water tank 50 is shown. An L-shaped pipe 81 is attached to the side face of the tank 50, and depending on the raw water level at least one pipe 82 is attached. The external diameter of the pipe 82 matches the internal diameter of the pipe 81 to fit onto the pipe 81.

As an example, when the level of the raw water reaches a position slightly higher than the height at which the fourth valve 63 is attached, the pipe 82 can be fitted and a transparent viewing window can be provided in the pipe 82 extending upward, whereby the level of the raw water can be checked. Accordingly, the raw water level can be checked through the viewing window while raw water other than the concentrated slurry is removed to the limit.

When the pipe itself is made of a transparent material such as glass, the raw water level can be checked without a separate viewing window being provided. And this checking means may be pre-installed.

On the other hand, on the lower left of FIG. 8, a means for collecting the water above the concentrated slurry to the limit is shown. That is, on the inside of the raw water tank 50, an L-shaped pipe 81 is mounted as shown in the figure. If an amount of silicon waste is specified, and if an amount of concentrated slurry is specified, the height of the head of the pipe 81 can be determined. Accordingly, if the head part of the pipe 81 or 82 is disposed in a place slightly higher than the top layer of the concentrated slurry, the raw water can be allowed to flow out of the filtering device 66 automatically to this height. Even if the fourth valve 63 is opened accidentally, the outflow of raw water can be stopped at the level of the head of the pipe 81 or 82. When the level of the concentrated slurry changes, the pipe 82 can be removed to adjust the collecting level of the raw water. Several pipes 82 may be prepared and any number of stages may be attached according to the level of raw water.

Although a method for collecting concentrated water by coagulating sedimentation has been described above, it may not be limited to this. For example, when the raw water 52 has reached a certain concentration, it may be moved to another filtering device 66 (FD). As an example, CMP (Chemical Mechanical Polishing) uses slurry with a chemical and abrasive grains of below 0.1 $\mu$m. And during polishing, water is supplied, and as wastewater something whose concentration is slightly lower than the slurry is discharged. However as the concentration of the raw liquid discharged increases as it is filtered, viscosity also increases. Since the polishing waste is very fine, the filtering capacity can rapidly fall. Consequently, when a predetermined concentration is reached, this raw liquid may be moved to another filtering device FD and filtered. That is, when filtering with the filtering devices 53 has continued and the raw water has reached a predetermined concentration, it may be moved to another filtering device FD and filtered. For example, as shown in the lower right of FIG. 8, the raw water may be fed to the upper side of a filter FT1 and the raw water may be vacuum-sucked with a pump P. And this filtering device may be mounted in a concentrated recovery pipe for recovery. The raw liquid is filtered through the filter FT1 and sucked until the highly concentrated raw liquid becomes somewhat solid. Meanwhile, as a result of the raw liquid being moved to the filtering device FD, the raw water level of the tank 50 falls; but dilute raw water can be supplied through the pipe 51. When the raw water concentration thins and the raw water immerses the filters completely, filtration can start again.

The filtering devices FD and 66 can be used as removed particle recovery devices. For example, when the raw water tank 50 containing silicon waste of semiconductor wafers reaches a predetermined concentration, instead of performing coagulating sedimentation, the raw water may be separated with the filtering device 66 (FD). Separated silicon waste is of high purity, and not having reacted with a chemical, it may be re-melted into ingots of Si for wafer use again. Furthermore, recovered Si can be reused as materials for tiles, cement and concrete.

As described above, the system of FIG. 8 is made up of the raw water tank 50, the filtering devices (immersion/suction) 53, and the small pump 57.

Because it is sucking at a low pressure (see FIG. 12) so that the first filters do not clog, the pump 57 can be a small pump. In the past, because only the raw liquid passed through a pump, the interior of the pump wore and the pump's life span was very short. However in this construction, filtered water passes through the pump 57, and therefore, its life is greatly increased. Consequently, since the scale of the system can be made small, electricity costs for operating the pump 57 can be reduced to about ⅕ to ¼ the cost of the prior operation and also pump replacement costs can be greatly reduced, and with the initial cost reduction of ⅓ and the running cost reduction overall of ⅕, it is possible to greatly reduce maintenance costs. According to the experimental results, 1 year operation without maintenance is possible.

And as shown in FIG. 5 through FIG. 7 the filtering devices 53 have a simple structure made up of the frame 30 for reinforcement and the filter films 31 and 32 and the pipe 34 attached to the frame 30, and pipes for transporting filtered water.

The filter films are polyolefin films and their mechanical strength is high so they do not break even when dropped, and their resistance to chemicals such as acids and alkalis is high. Consequently, whereas in the past, as shown in FIG. 12, the raw water concentration of about 300 milligrams/liter was the maximum that was able to be handed. With this apparatus, about three times the previous concentration, about 900 milligrams/liter, can be handled, and direct chemical coagulating sedimentation with the installed filter films can also be performed.

And when the raw water tank is used for coagulating sedimentation, extra pipes and pumps and so on become unnecessary, and a resource-saving filtering system becomes possible. For example, with a system to which five dicing apparatuses are attached, performing coagulating sedimentation once or twice are year is sufficient. Consider a 5-inch dicing wafer, which has a thickness of 625 $\mu$m, weighs 6 grams, and has a blade of 40 $\mu$m in width in the grooves of dicing depth 180 to 200 $\mu$m. An average 160 of those are formed in a grid. One dicing wafer produces about 0.3 grams (about 5% of one wafer) of sludge (silicon waste).

Because the filtering device performs its function by suction, as shown in FIG. 12, fine particles do not enter the fine pores of the filter films at low flow rate and low pressure. Furthermore, by forming the second filter films, the fine particles can be prevented from entering into the fine pores of the first filter films. Thus, the filtering performance can be improved. By means of an external force such as air bubbles, continuous filtering is possible. The filtering (suction) rate can be 0.3 to 0.5 meters/day, the filtering (suction) pressure can be 0.2 to 0.5 kg/cm$^2$, and the life of the filtering films can be expected to be over five years. And the filtering speed and filtering pressure are set in a range such that there is no disruption of the second filter films because of breaking or deformation of the first filter films, and filtering speeds of 0.01 to 5 meters/day and filtering pressures of 0.01 kg/cm$^2$ to 1.03 Kgf/cm$^2$ (1 atmosphere) are essentially possible.

With the suction rate of 0.3 meters/day, 252 liters/(one filter film) of raw water can be processed in one day, and with the suction rate of 0.5 meters/day, 450 liters/(one filter film) of raw water can be processed in one day. The size of the frame of the filter can be about 100 cm×50 cm×10 mm.

And in the dicing process, 3 to 5 liters/min of pure water may be necessary, and in a year 18000 tons may be used. To make pure water for dicing, it takes about 500 Yen to 1000 Yen/ton. However by using this system of the present invention, because filtered water can be reused, cost reduction is possible. As mentioned above, with the initial cost being ⅓ the prior cost and since running costs overall can be reduced to ⅕ the prior cost, the maintenance costs can be greatly reduced.

The concentrated raw liquid has been treated as industrial waste, and the processing of this waste costs 3 million Yen/year. However by reusing filtered water, and reusing separated Si, the quantity of the concentrated raw liquid can be essentially reduced to zero, and the rate of resource recycling can be about 97.6%.

Furthermore, the adhesion of silicon waste to the filter film interior can be prevented, and back-washing, which had hitherto been necessary, has become unnecessary.

Although the foregoing description was made with silicon waste arising from a Si wafer as the removables, this invention can be utilized in other fields, as explained previously. In those fields, wastewater caused damages to earth's environment, but by employing this invention such damages can be greatly reduced For other examples of industrial waste production, there are garbage incinerator plants that produce substances having dioxins, uranium purifying factories that produce radioactive waste substances, and factories producing powders that produce harmful industrial waste substances. By employing the invention, waste having harmful substances can be removed regardless of the size of the harmful substances.

And if the removables are inorganic solids including at least one element among those of 2a group through 7a group, and 2b group through 7b group in the periodic table, those removables can be almost completely removed by employing this invention.

Figure 9:
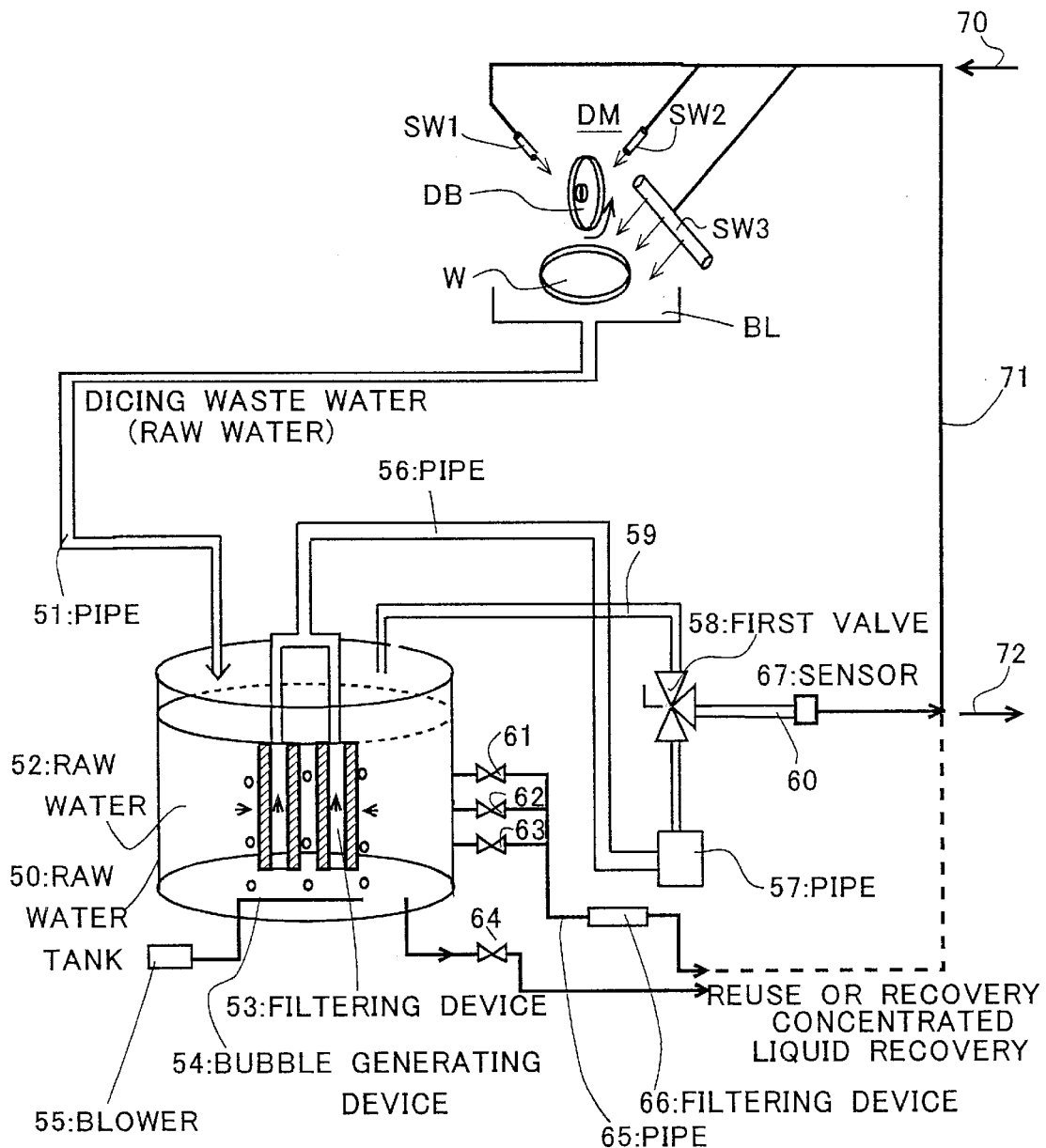
FIG. 9 shows a system in which an exemplary filtering method of the invention is used for a dicing apparatus.

The filtering system of FIG. 8 combined with a dicing apparatus system is shown in FIG. 9. Some common parts in FIG. 8 are omitted in FIG. 9 for brevity.

A semiconductor wafer W is attached to a table of the dicing apparatus. SW1 and SW2 are showers for spraying pure water on a dicing blade DB. SW3 is a shower for showering the wafer W and removes silicon waste arising from the wafer W during dicing. The shower SW3 may supply water from above the wafer or from the side. The position of the shower SW3 is not limited to a particular position. It is only necessary that a flow of water is produced on the wafer surface.

There is a receptacle BL below the wafer W for receiving wastewater, and the pipe 51 connected to the raw water tank 50 is attached to a lower part of the receptacle tray BL.

Accordingly, as described above with reference to FIG. 8, wastewater produced in the dicing apparatus passes through the raw water tank 50 and the filtering devices 53 and becomes clean water (filtered water) again, and is transported out through the pipe 56 and the pipe 60. The filtered water may be reused as pure water for the dicing apparatus through a pipe 71, or may be reused in another place through a pipe 72. If it is reused in another place, the pipe 71 is removed, and separate pure water is supplied through a pipe 70. The filtered water can also be returned to nature.

Figure 10:
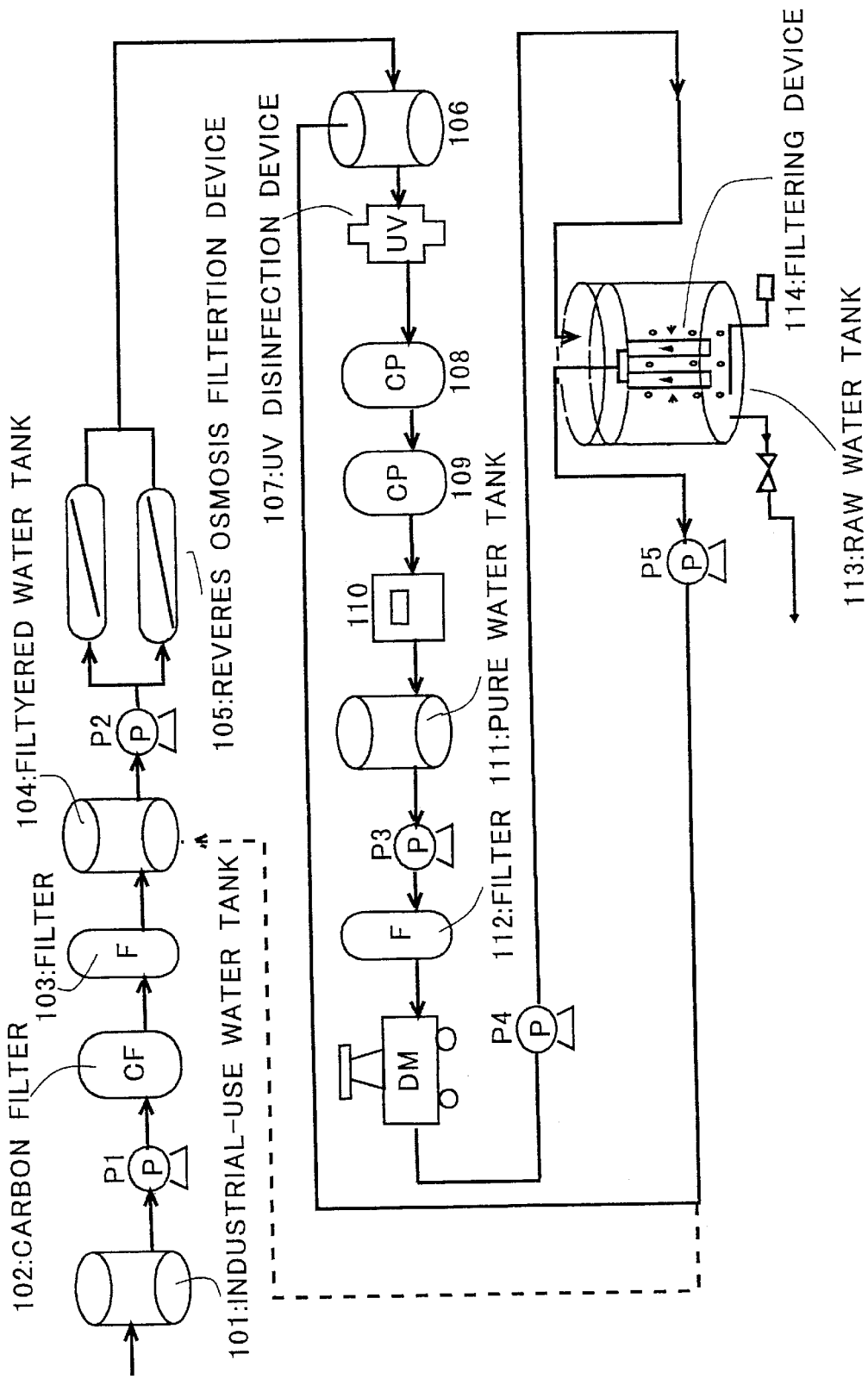
FIG. 10 shows a system view illustrating an exemplary filtering method of the invention.

An exemplary system will be explained using FIGS. 9 and 10.

Industrial-use water is stored in an industrial-use water tank 101. The industrial-use water is transported by a pump P1 through filters 102 and 103 to a filtered water tank 104. The filter 102 is a carbon filter, and removes debris and organic matter. The filter 103 removes carbon arising from the filter 102.

The filtered water is transported by a pump P2 through a reverse osmosis filtration device 105 to a pure water tank 106. This reverse osmosis filtration device 105 uses reverse osmosis films, and waste (debris) below 0.1 $\mu$m is removed. The pure water of the pure water tank 106 is transported to a pure water tank 111 through a UV disinfection device 107, adsorbing devices 108 and 109 and a device 110 for lowering the resistance of the pure water.

The UV disinfection device 107 as the name suggests disinfects the pure water with ultraviolet rays, and devices 108 and 109 are for removing ions by ion exchange. A device 110 is for mixing carbon dioxide gas into the pure water. When the resistance of the pure water is high, problems such as charging up of the blade arise. To prevent this the device 110 deliberately lowers the resistance of the pure water.

Using a pump P3 the pure water is supplied to a dicing apparatus DM. At 112, waste (debris) over the size of about 0.22 $\mu$m is removed again.

Then wastewater produced in the dicing apparatus DM is stored in a raw water tank 113 using a pump P4, and filtered by a filtering device 114. The process is the same as that discussed in FIG. 5 through FIG. 8. Filtered water filtered by the filtering device 114 is returned to the filtered water tank 104 and reused. Depending on the filter diameter and filtering capacity of the filtering device 114, the filtered water may be returned to the pure water tank 106, as shown by a solid line.

In the filtering device 114, when silicon waste is mixed with the filtered water, it is returned to the raw water tank 113, as in FIG. 4.

The raw water tank 113 is the raw water tank 50 employed in FIG. 8, and by providing an immersed filtering device in the raw water tank 113, the raw water tank itself becomes a concentrated water tank, and the filter film also including silicon waste functions as a filter, and when silicon waste is mixed with the filtered water, it is returned to the raw water tank using a valve similar to the valve 58 in FIG. 8.

Figure 11:
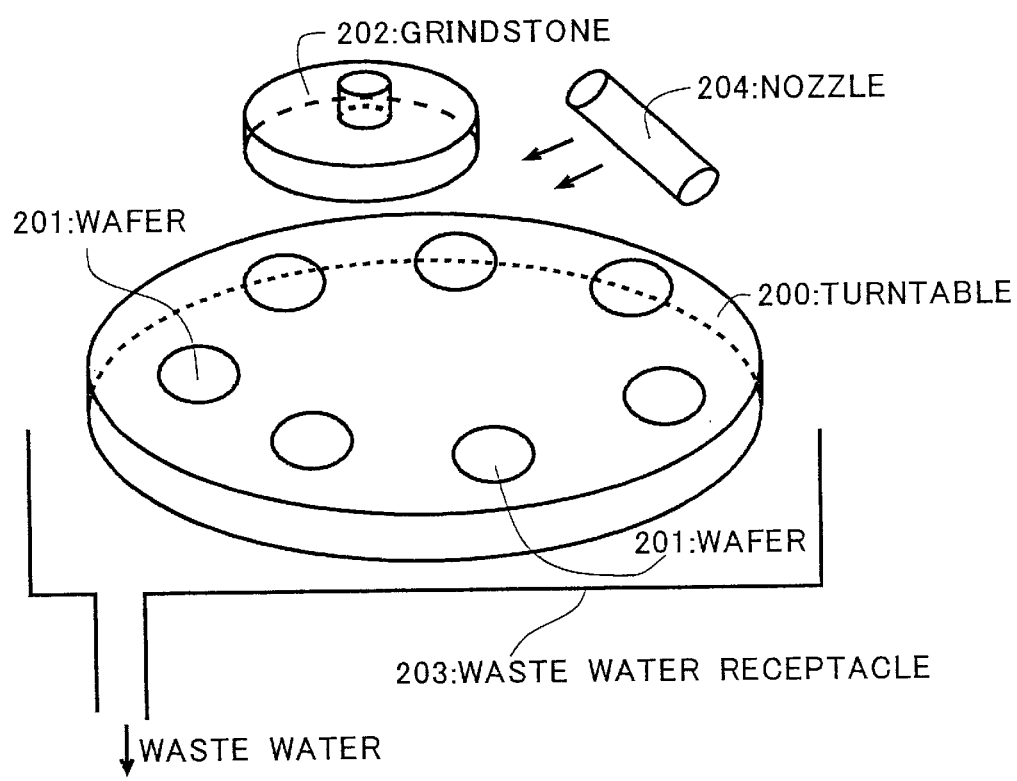
FIG. 11 shows an exemplary grinding or polishing method such as back-grinding.
Figure 13:
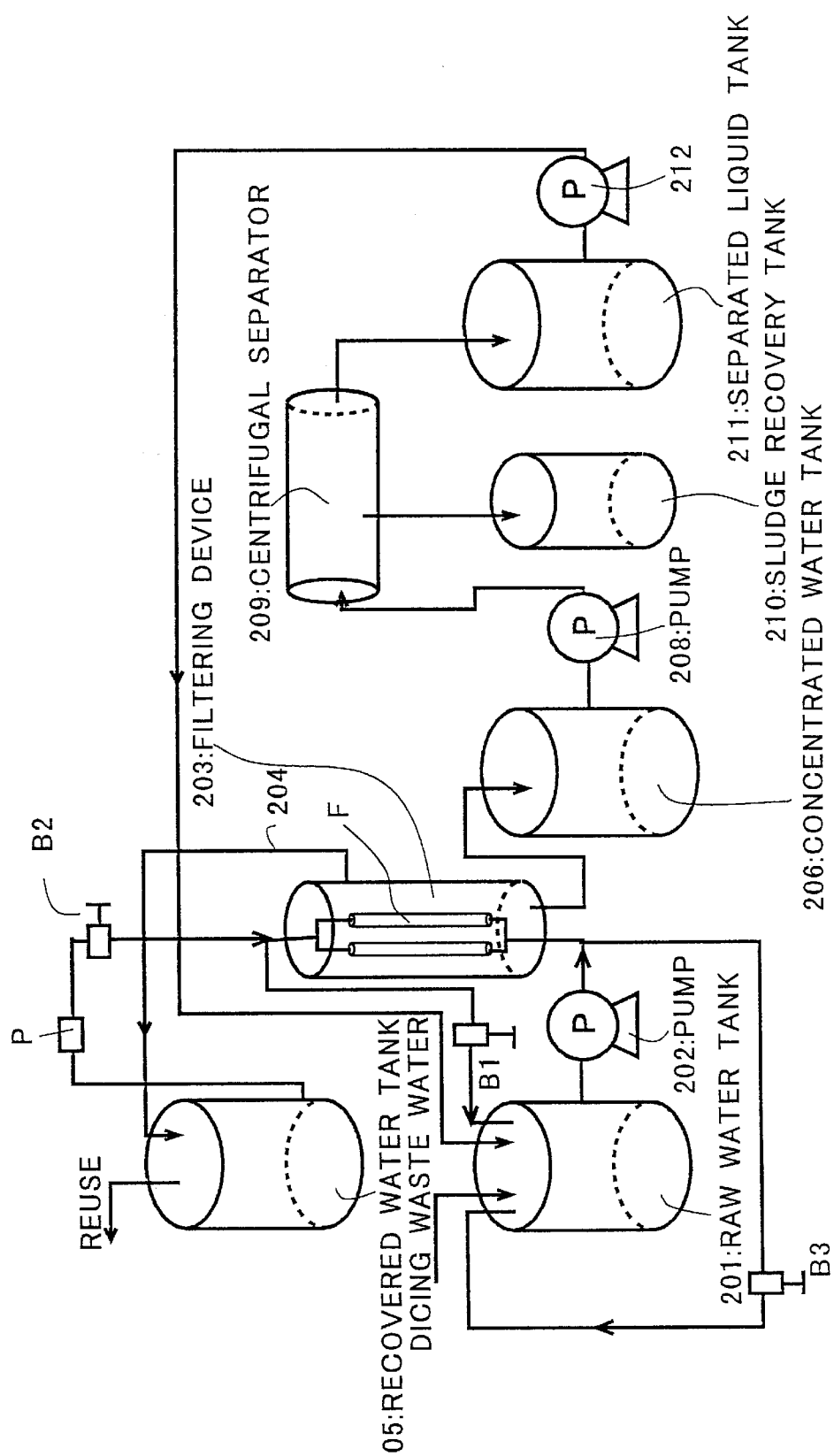
FIG. 13 shows a conventional filtering system.

A back-grinding apparatus is shown in FIG. 11. Even if this apparatus is installed in place of the dicing apparatus, because Si waste is still mixed in with the wastewater the foregoing embodiment can be employed.

Like dicing back-grinding also has a turntable 200, and at least one wafer 201 is placed on this. From above a grindstone 202 is brought into contact with the wafer, and the wafer rear face is ground. A nozzle 204 is constructed so that filtered water can be supplied from a pipe similar to the pipe 60 in FIG. 9 and FIG. 10 and reused. The turntable 200 is a spool type and rotates, and the grindstone also rotates. A wastewater receptacle 203 receives wastewater produced in this grinding, and it is transported through the pipe 51 to the raw water tank 50.

Furthermore, another embodiments of the present invention will now be described.

Solid material collected in waste water is generated by grinding, cutting or abrasive processes, and is combined with a fluid. For example, when a crystal body, such as an Si wafer, is ground, cut or abraded, Si dust is removed and carried away by water, generating waste water in the process.

A relationship existing between a fluid and a solid material precludes the substantial generation of a gel or collide reacting material produced by a chemical reaction. For example, for pure water and Si, the first premised condition is that Si must generate an environment wherein a reacting substance that causes a gel or colloid clog is not formed. Further, a condition is required wherein, even if this substance is formed, there is no drastic deterioration of filter devices in waste water tanks or of filter devices used for transfer equipment. For this reason, the pH of the fluid is controlled. Further, when Si is handled as a solid material, the water must be either neutral or weakly acid.

For the filtering of a solid consisting of, for example, Si, either pure water, or industrial water, well water or city water may be employed as a fluid. Since the environments from which water other than pure water is obtained vary, the pH of the water will likewise vary. In particular, when a pH reading rises and indicates water is strongly alkaline, silicic acid ions are increased and part of them coalesce, forming a substance, such as a gel or a colloid, that can cause clogging. Therefore, to ensure that waste water is neutral or weakly acid, a pH adjustment device must be installed along a water path and in a waste water tank. And since when waste water is discharged from the waste water tank to a tank mounted on a transfer apparatus it must be prevented from becoming alkaline, special care must be taken to ensure that an adequate quantity of a chemical used to eliminate alkalinity is diffused throughout the discharged waste water.

An explanation will now be given for the environments wherein dust occurs.

A first environment is an industry for the processing of crystals or of compound ingots made of a semiconductor material to produce wafers or plates.

FIGS. 20 to 25 are diagrams for explaining the processing employed when machining semiconductor wafers.

Figure 20:
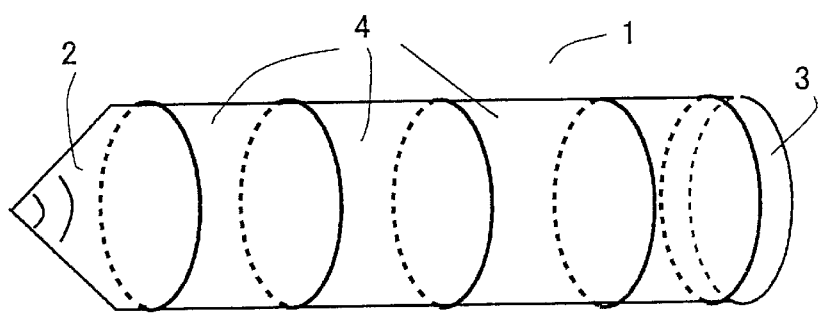
FIGS. 20 to 25 are diagrams for explaining a processing for machining semiconductor wafers.

In FIG. 20, a single crystal of Si, for example, is drawn out into an ingot 1 of, in this instance, 8 inches by 2 meters. Any unnecessary portions at the upper and lower ends 2 and 3 of the ingot 1 are cut off, and the remainder is divided into several cylindrical blocks 4. At this time, water is supplied while a blade (not shown) is used to cut the ingot 1 (first abrading and grinding step).

Figure 21:
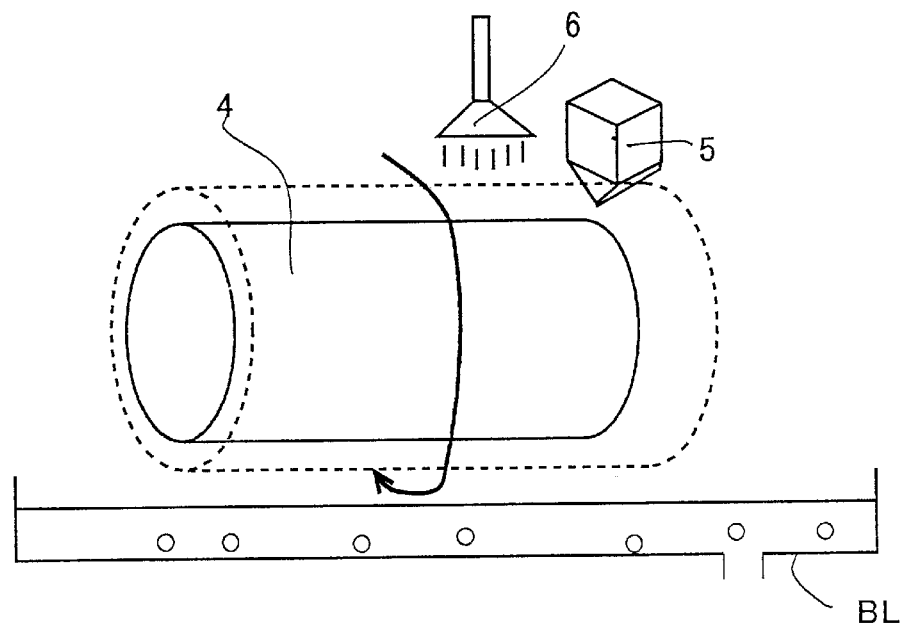

Then, as is shown in FIG. 21, a grinding blade 5 is used to grind the circumferential surface of each cylindrical block 4 to obtain a predetermined wafer diameter. During this process, water supplied by water supply means 6 is used to shower and protect the grinding blade 5 and the blocks 4 (second abrading and grinding step).

Figure 22:
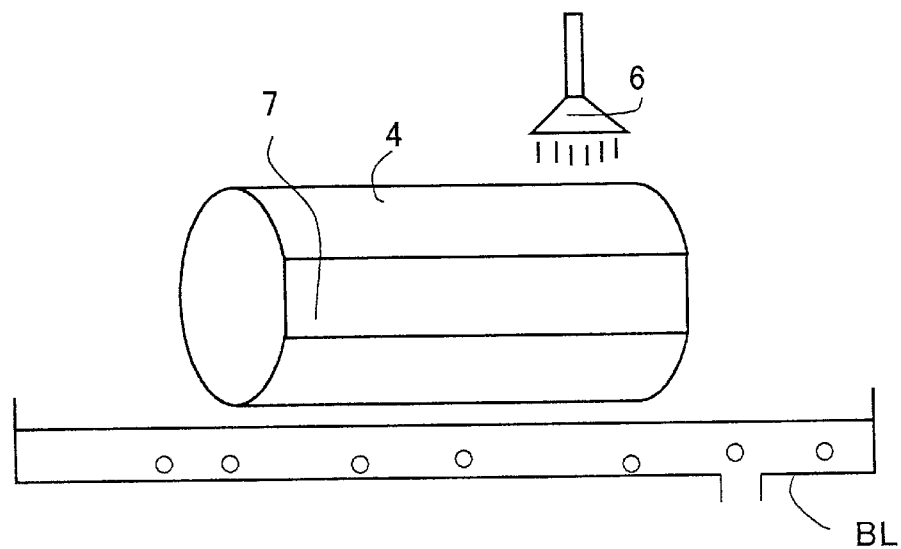

Following this, as is shown in FIG. 22, orientation flats 7 are formed on the blocks 4 to designate the plane crystal orientation of a wafer. During this process also, water is supplied by the supply means 6 (third abrading and grinding means).

Figure 23:
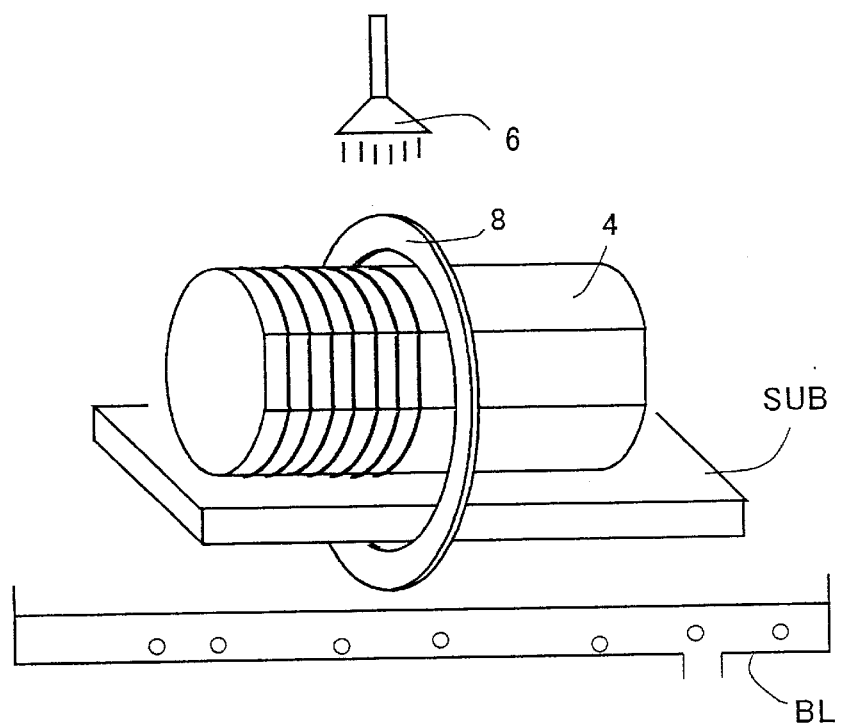
Figure 24:
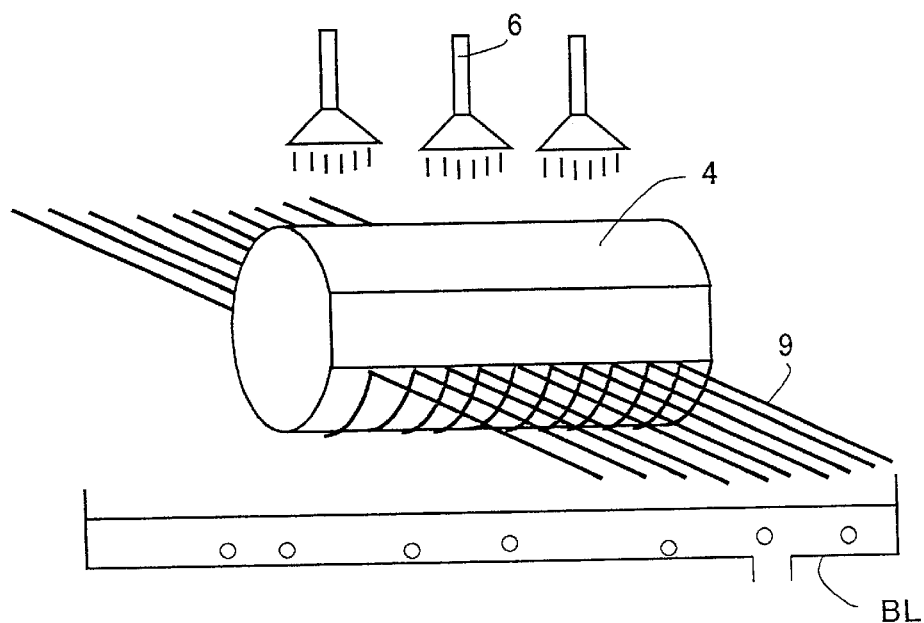

Sequentially thereafter, as is shown in FIGS. 23 and 24, the block 4 is glued to a support base SUB by an adhesive, and is cut into individual wafers. In FIG. 23, guide cuts are made in the block 4 by a blade saw 8 to which diamond grains are adhered, and in FIG. 24, abrasive diamond slurry supplied along extended piano lines 9 is used to slice the block 4 into wafers. Water for these processes is also supplied by the supply means 6.

After the block 4 has been cut, a chemical is used to separate the wafers from the support base by melting the adhesive securing them. If at this time the adhesive and the chemical were permitted to flow with the waste water to the waste water tank, a pH reading for the waste water would indicate it is alkaline, which will be described later. Thus, when removing the adhesive from the wafer, at the least it is necessary to prevent the chemical used for the removal from flowing with the generated waste water to the waste water tank. In this instance, to remove waste water, cleaning equipment for each support base SUB must be mounted that includes a path that does not lead to a waste water tank (fourth abrading and grinding step).

In addition, in order to prevent chipping of corners of the wafer, wafer wrapping are performed. For example, the side faces that constitute part of the circumference of the wafer are chamfered. The chamfering may also be performed for both ends of the cut face that is used for orientation, i.e., the portion that contacts the circumferential sides (fifth abrading and grinding step).

Furthermore, a wrapping device shown in FIG. 11 is employed to mechanically and chemically abrade the obverse surface and/or the reverse surface of the wafer (sixth abrading and grinding step).

At the above first to sixth abrading and grinding steps, almost only water is supplied to the abrading and grinding means. And while taking into account the abrasive processes that are performed, it is apparent that chemical materials, such as active surface agents and lubricants, will be dispersed in the water. Since these agents may react with Si, the acidity and alkalinity of the waste water itself must be adjusted so that it is neutral or weakly acid. If such and adjustment is not performed, separate waste water tanks must be provided for waste water consisting of water and Si, and for waste water consisting of water, Si and the above chemical materials, because gel or colloidal material that can cause clogging can be generated in the presence of the chemical materials. However, when the acidity and alkalinity of the third type of waste water is adjusted so it is neutral or weakly acid, both types of waste water can be discharged to a single waste water tank.

Following the above steps, without any special processes being performed and without impurities being introduced or surface defects being processed, the pure crystal wafers are shipped.

These wafers are used by semiconductor manufacturers for the production of desired ICs. ICs are formed in a matrix shape on a wafer, and a passivation film, at the least, such as a resin film or an Si nitride film, is applied that at least covers the upper surfaces of the ICs. Generally, either only a polyimido resin is used for this topmost layer, or an Si nitride film is formed under the polyimido resin.

Back wrapping is also performed for the wafer, which initially is thick and difficult to dice, in order to reduce the electrical resistance of the reverse face and to reduce the thickness of an IC package. The wafer is thinned until its thickness is equal to or less than 300 $\mu$m, for example. The back wrapping device used here is shown in FIG. 11. A wafer 201 is mounted on a turn table 200, and the reverse face of the wafer 201 is ground by a wheel 202. A nozzle (shower) 204 is used to supply water (seventh abrading and grinding step).

Figure 25:
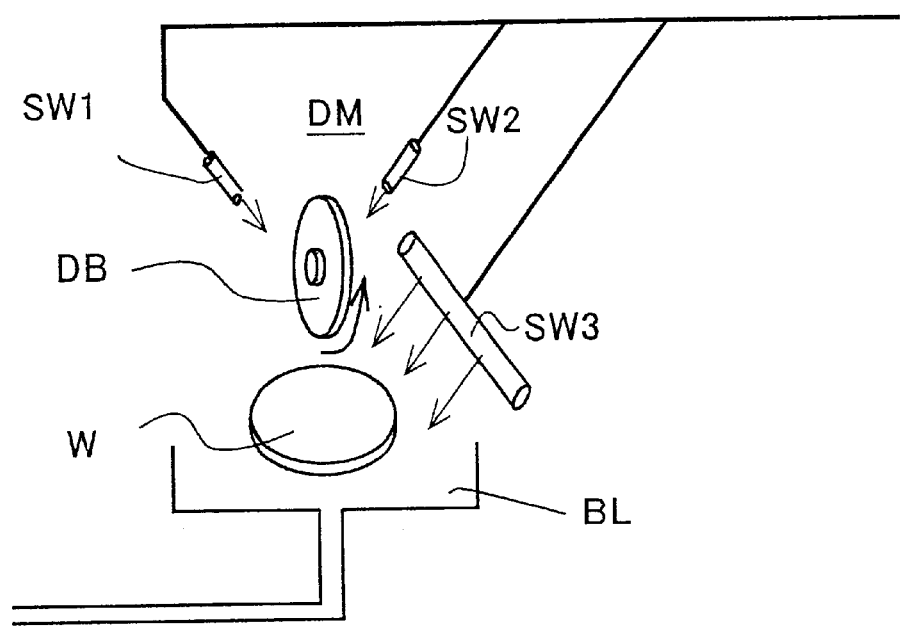

Finally, the semiconductor wafer is diced, as is shown in FIG. 25. Showers SW1 and SW2 are provided for supplying water for a shower blade DB, and a shower SW3 is used to supply water for a semiconductor wafer W.

Generally, the passivation film is removed along the dicing line, and since the portion along the dicing line is formed of Si, Si oxide and an inter-layer insulating film, the dicing dust is composed of these materials. However, normally the filtering process is not at all affected when a semiconductor wafer W coated with a passivation film is diced (eighth abrading and grinding step).

Figure 26A:
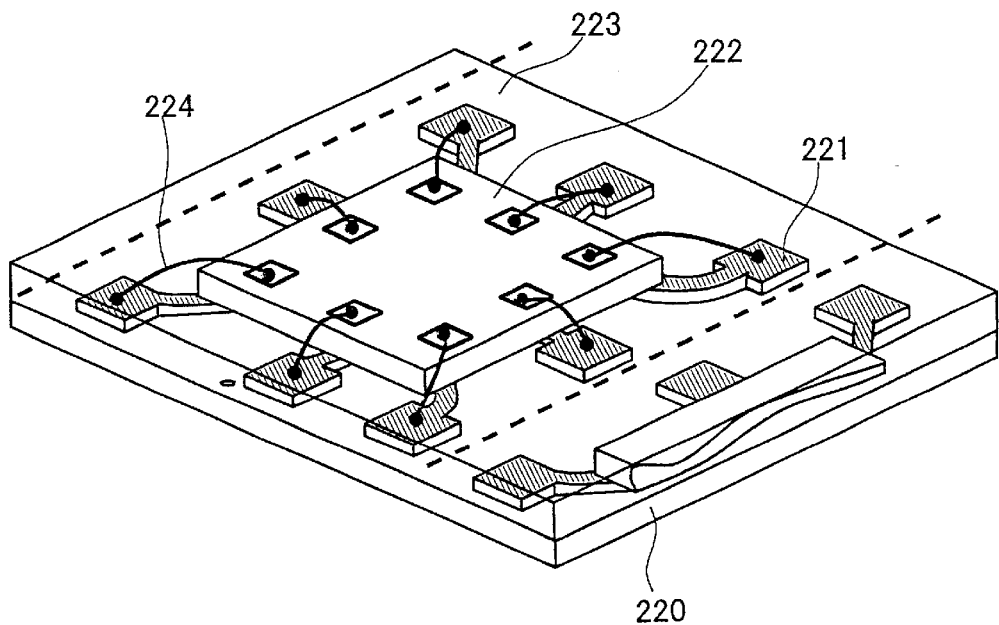
FIGS. 26A and 26B are diagrams for explaining a dicing process of the semiconductor devices.

The semiconductor chips obtained by dicing may be further processed as CSPs. For example, in FIG. 26A, semiconductor chips 222 are mounted in a matrix shape and fixed to electrodes 221 that are connected to a support substrate 220, such as a print substrate, a ceramic substrate or a flexible sheet, and the entire structure is enclosed using a sealing resin 223. This structure is then diced along the broken lines to obtain individual semiconductor devices. In this case, all of the electrodes 221 may be connected by fine metal lines 224, while taking plating into account, so that there are cases wherein the dust that is generated consists of electrode and sealing resin materials, and cases wherein all the electrodes are processed in an island shape and the dust that is generated consists of only sealing resin material. The semiconductor chip 222 used in this example is a face-up type employing the fine metal lines 224. As another example, a face-down type employing a bump may also be employed.

Figure 26B:
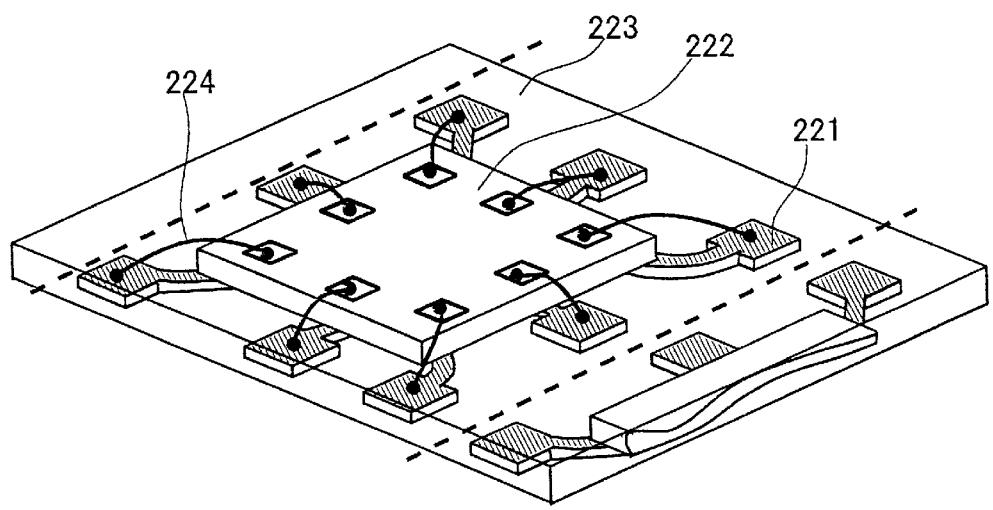

Another structure is as is shown in FIG. 26B wherein the support substrate 220 is not provided. In this case, the overall thickness is reduced by a value equivalent to the thickness of the support substrate. Since the dicing of the support substrate is not required, a solid consisting of the support substrate material is not generated (ninth abrading and grinding step).

As is described above, in the semiconductor manufacturing process, there are many abrading and grinding steps, and for these steps, means is employed to supply water, such as well water, city water or industrial water, or pure water, such as distilled water or ion-exchange water.

In the dicing device, for example, a waterproof nozzle is provided in order to prevent a rise in the temperature of a dicing blade and the attachment of dicing dust to a semiconductor wafer, to introduce pure water to the wafer, and to feed pure water to the blade. Further, when the thickness of a wafer is reduced by back grinding, pure water is also supplied for the same reasons.

In this invention, the waste water is filtered, part of solids are caked, and the remaining waste water, which has a low density, is returned to the waste water tank.

Figure 14:
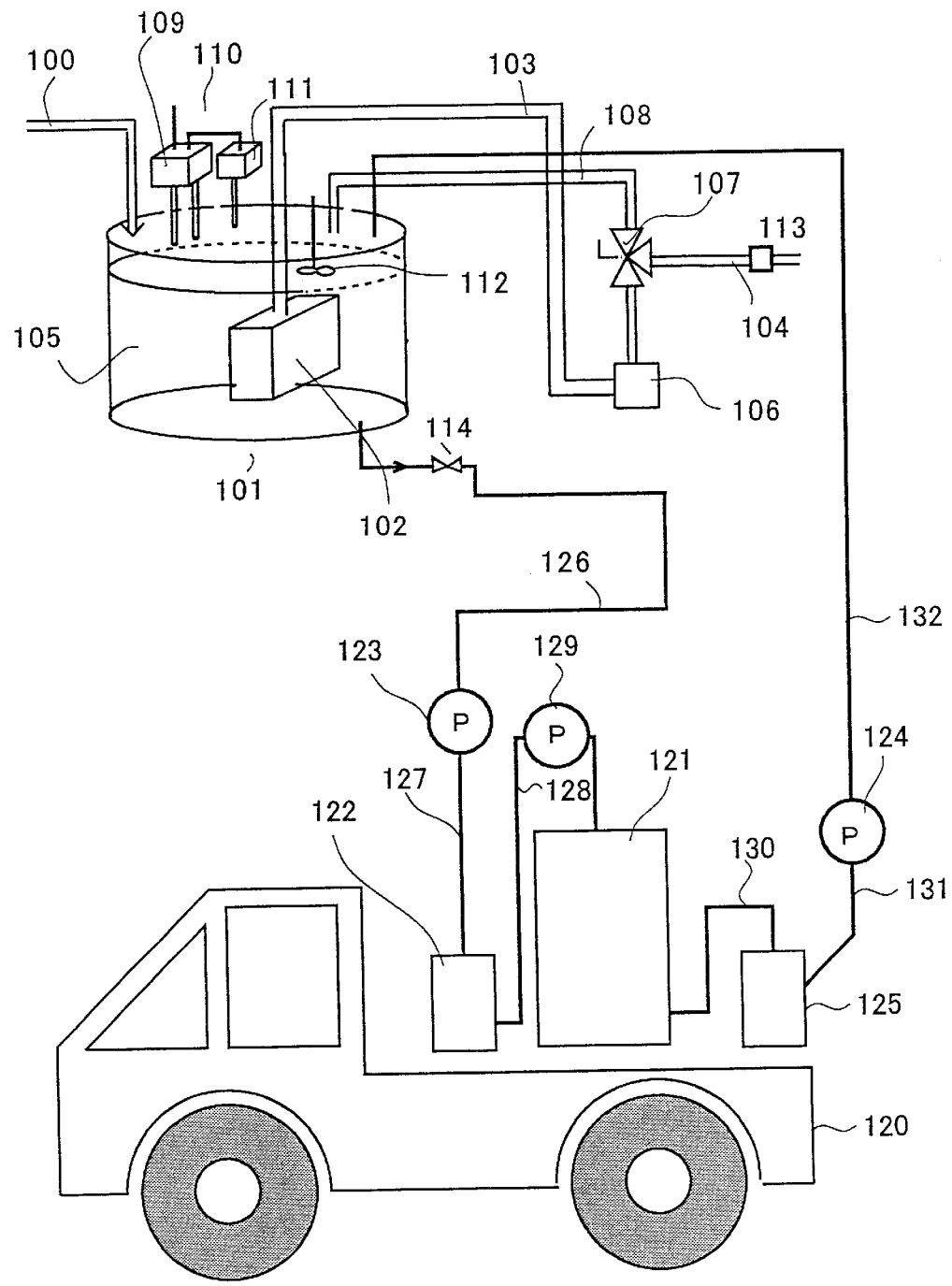
FIG. 14 is a diagram showing a relationship of a wastewater-water tank and a transferring apparatus.

This concept is illustrated in FIG. 14. The waste water generated at the abrading and grinding location flows along a pipe 100 to a waste water tank 10 and is retained therein. Fluid is extracted by a first filter device 102 provided for the waste water tank 101, and is transferred externally via pipes 103 and 104. Reference numeral 105 denotes waste water; 106, a pump; 107, a first valve for changing the filtered liquid transfer destination; 108, a pipe for circulating a filtered liquid; 109, a chemical injection device; 110, a pH adjustment device; 111, a pH sensor; 112, agitation means; 113, a sensor for detecting the level of the residual solid; and 114, a pipe for externally transferring the waste fluid in the waste water tank.

Since the waste water 105 in the waste water tank 101 is continuously filtered, the density of the waste water is increased. And as the density of the waste water 105 is increased, the function of the first filter device 102 is deteriorated.

A transferring apparatus 120 collects the solid accumulated in the waste water tank 101. The transfer apparatus 120 can be moved in order to collect solids from waste water tanks that are located here and there in a factory, or from waste water tanks that are located in different areas. Basically, a flatcar having no self-propulsive capability can be employed, however, a wagon, such as a truck, is preferable because of the size of the equipment to be mounted on it and the distances between waste water tanks. Further, as needed, a device mounted on the transfer apparatus may be securely fixed around the waste water tank 101.

Mounted on the transfer apparatus 120 is a second filter device 121 for filtering the waste water 105 received from the waste water tank 101 and for forming a solid into a cake. The filter device 121 filters the water it receives and returns it to the waste water tank 101 to reduce the density of the waste water 105.

The second filter device 121 is formed by, for example, filter pressing, and in accordance with its filtering capability, a condensed waste water tank 122 is mounted on the transfer apparatus 120. The waste water tank 101 is quite large, and the waste water 105 flows into the condensed waste water tank 122 under the pressure produced by its own weight. A first transfer pump 123, which is provided to regulate the speed and rate of flow, may be attached either to the transfer apparatus 120, or separately located.

A second transfer pump 124 is provided in order to return to the waste water tank 101 the filtered fluid discharged by the second filter device 121. This pump 124 also may be attached either to the transfer apparatus 120 or separately located. In addition, a filtered liquid tank 125 may be provided in front, while taking into account the transfer efficiency of the second transfer pump 124. This is because, when a certain amount of filtered liquid is retained in the filtered liquid tank 125, this liquid can be returned to the waste water tank 101 through the second transfer pump 124.

Transfer means (a pipe or a hose) 126, which is, for example, extended from the transfer apparatus 120 and attached to the waste water tank 101, is attached to the fist transfer pump 123, and transfer means 127 is located between the first transfer pump 123 and the condensed waste water tank 122. Transfer means 128 is located between the condensed waste water tank 122 and the third transfer pump 129, which is between the condensed waste water tank 122 and the second filter device 121, while transfer means 130 is located between the second filter device 121 and the filtered liquid tank 125. Transfer means 131 is located between the filtered water tank 125 and the second transfer pump 124, while transfer means 132 is attached to and extends from the second transfer pump 124 to the waste water tank 101.

Thus, the waste water 105 is transmitted to the transfer apparatus 120, and is separated into a filtered liquid (waste water) having a low density and a solid. The filtered liquid having a low density is returned to the waste water tank 101 to reduce the density of the waste water 105, and to improve the function of the first filter device 102.

The second filter device 121 is the feature of the invention. Generally, a filter device removes a solid and generates a filtered liquid wherein no solid is mixed. In this embodiment, these are not the objectives of the filter device.

The first objective is the rapid reduction of the density of the waste water in the tank, and the second objective is the rapid collection of a solid that is trapped by the second filter device 121 to reduce the density. In this case, the solid is formed into a cake.

Therefore, the pores of the second filter device 121 has a larger diameter than the first filter device 102, so that the device 121 can capture a solid at a certain speed and need not clean the filtered liquid. Thereafter, the filtered liquid, which has a lower density than the waste water 105 in the waste water tank 101, is returned to reduce the density of the waste water in the waste water tank 101. The filter mesh of the second filter device 121 has an air passing level of 100 to 200 cc/cm²/min., and is larger than 0.25 μm. This air passing level can be adjusted depending on the solid size.

A conventional filter device can reduce the density of the waste water only 30 to 300 ppm at the maximum. When this water is filtered below the above described air passing level, not much solid can be collected because the waste water contains only a small amount of solid.

However, in this invention, dark waste water (500 to 40000 ppm) is roughly filtered, and the translucent filtered liquid is returned to the waste water tank 101. Since the density of the waste water 105 is increased by the filter device of the present invention, and the waste water is roughly filtered at high speed, the collection efficiency of the second filter device is improved.

In FIG. 14, even when the transfer means 123, the condensed waste water tank 122 and the third transfer pump 129 are not provided, the waste water can be supplied to the second filter device 121 by the pressure produced by its own weight. Further, the second filter device 121 can employ the filter press method, the natural drop method or the pressurization method. These methods will be descried later while referring to FIGS. 18A and 18B.

Figure 16:
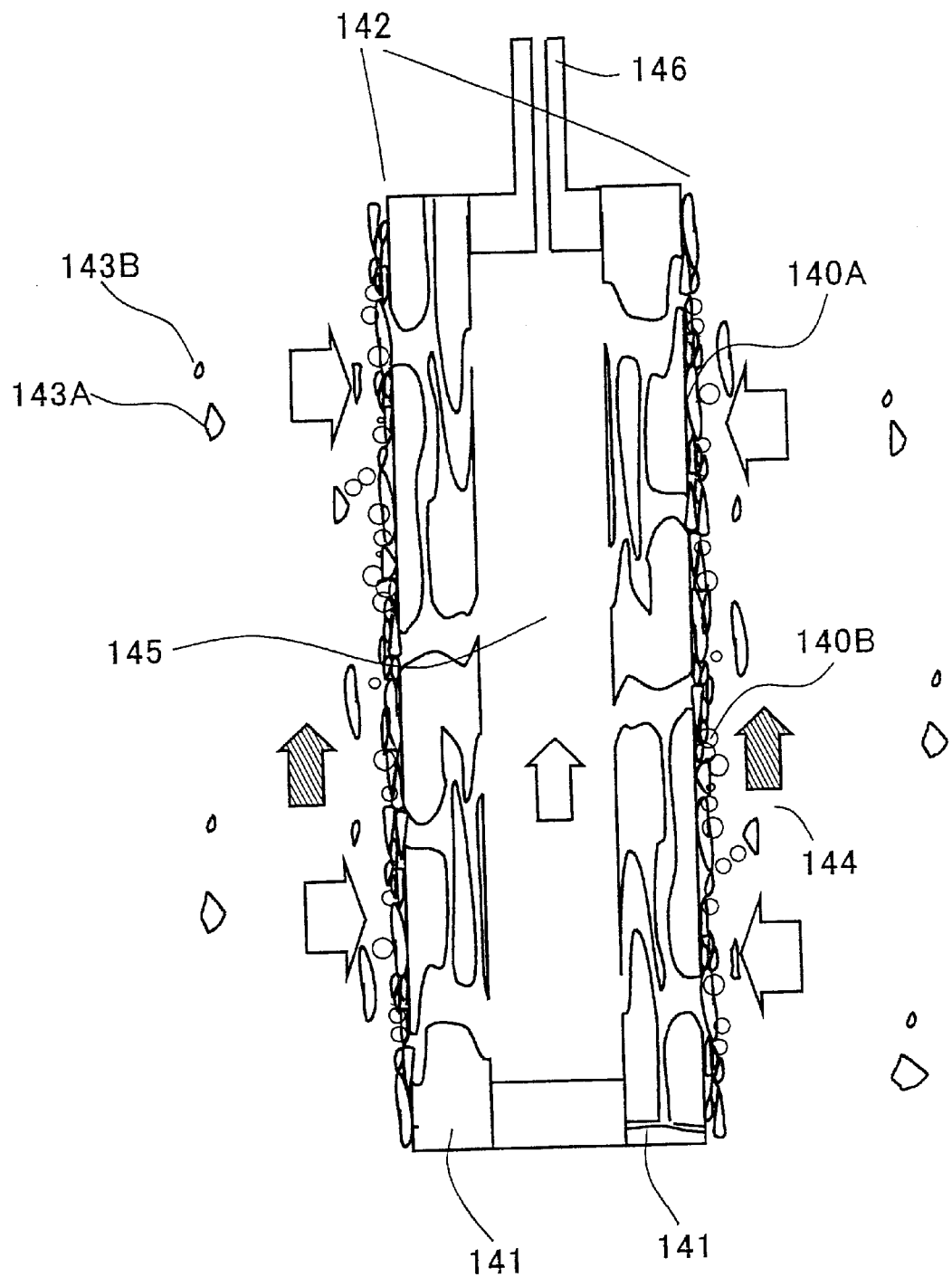
FIG. 16 is an exemplary filtering operation of a filtering system in a waste-water tank.

The amount of waste water to be transferred to the transfer apparatus is limited. That is, even when the water is transmitted to the transfer apparatus, the filter device 102 must be completely immersed in the waste water 105. This is because the filter in FIG. 16 would dry out while in contact with air and the filtering function would be deteriorated. In this embodiment, the condensed waste water tank 122 has a capacity of 500 liters and the filtered liquid tank 125 has a capacity of 250 liters. That is, even when 500 liters of waste water is extracted from the waste water tank 101, the filter is completely immersed, and when 250 liters of water is held in the filtered liquid tank 125, it is returned to the waste water tank 101. The filter, therefore, is constantly immersed.

Figure 15:
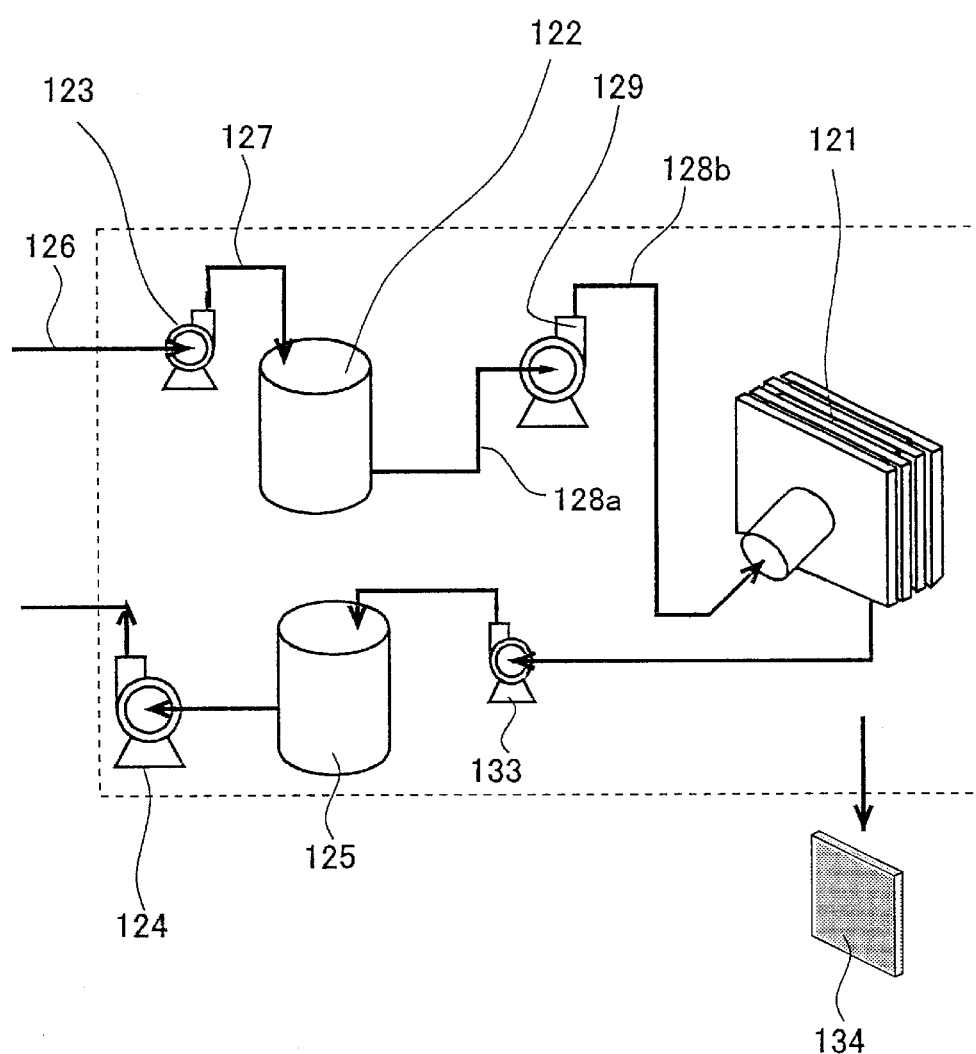
FIG. 15 is a diagram showing a filtering system installed in a transferring apparatus of the present invention.

FIG. 15 is a diagram showing a system wherein a filter press is used as the second filter device 121. Since a filter press extracts a constant amount of waste water, the condensed waste water tank 122, the third transfer pump 129, the filtered liquid tank 125 for retaining filtered liquid, and the filtered liquid transfer pump 33 are required.

A filter press is a well known filter device, and has, for example, the structure shown in FIGS. 17A to 17F. The structure of the filter press will be described in detail later. A filter press filters waste water, and separates it into a cake and a translucent filtered liquid. When a specific quantity of filtered liquid is transmitted through the filtered liquid and retained in the filtered liquid tank 125, the filtered liquid is returned through the second transfer pump 124 to the waste water tank 101.

As is described above, as the density of the waste water is increased, the rate of collection of a solid is increased. The conventional device, however, increases the density of the waste water only to 30 to 300 ppm at the maximum. Whereas, with this invention the density of the waste water can be much increased to 500 to 40000 ppm using the following method.

An explanation will now be given for the reason that a set of substances to be removed and/or a set of solids can be used as a filtering film having a high effective filtering function.

In order to filter a target material that is included in waste water in a tank and is to be removed, the present inventor considered the use of this material as a filter film in order to filter the material that is to be removed.

For example, the material generated at the first to ninth abrading and grinding steps can be used as the materials to be removed, and consist mainly semiconductor material, insulating material and metal material. An organic material, such as Si, Si oxide, Al, SiGe and a sealing resin, and another insulating material or a metal material are pertinent to these materials to be removed, as is a semiconductor compound, such as GaAs or SiGe.

Since the quantity of the metal material produced, especially at the eighth and ninth abrading and grinding steps, is quite small relative to all the ground or abraded dust generated, accordingly, the amount of material that reacts with water is small and does not cause clogging. When the dust is used as the solid of the second filter film 142, however, the absence of this metal is more preferable, and the second filter film may be formed of the dust generated at the first to the seventh abrading and grinding steps.

Further, dicing is performed at the ninth abrading and grinding step. During this process, the surface of the wafer is covered with resin, and after the resin is finally sealed, it and the wafer are diced together. There is another dicing method whereby the semiconductor chip is arranged in a matrix shape on a ceramic substrate, the semiconductor chip and the ceramic substrate are covered with the resin, and the finally sealed resin and the ceramic substrate are diced. With this method also, a material to be removed is generated during dicing.

According to the results of experiments, a density of 500 to a maximum of 4000 ppm is available. Therefore, since in the waste water the density of the material to be removed is very high, this material can be efficiently formed into a cake even by using a rough filter, as explained by referring to FIGS. 14 and 15.

The principle of the filter press will be briefly explained by referring to FIGS. 17A to 17F. A filter 150 is a cloth cylinder having top and bottom openings.

As is shown in FIG. 17A, the filter 150 is located between pressing means 151 and a filter supporter 152, and as in FIG. 17B, the bottom opening of the filter 150 is closed by first holding means 153. In this state, the filter 150 forms a bag 154, in which condensed waste water can be retained.

Then, as is shown in FIG. 17C, condensed waste water 156 is supplied via waste water supplying means 155 to the bag 154 constituted by the filter 150. As is described above, since the air passing level of the filter 150 is 100 to 200 cc/cm²/min., the condensed waste water 156 can be retained in the filter 150.

Following this, as is shown in FIG. 17D, the top opening of the bag 154 is closed and held by second holding means 155. As a result, the condensed waste water 156 is contained within the bag 154, the top and bottom openings of which are closed. As is shown in FIG. 17E, when the pressing means 151 and the filter supporter 152 presses the filter 150, the filtered liquid is forced out and passes to the filtered liquid tank 125 below, where it is held until it is returned to the waste water tank 101 shown in FIG. 14. Since the filter mesh is rough, the filtered liquid can be extracted as a cake comparatively quickly. While even though the filtered liquid is not clear, it has a lower density than the water in the waste water tank 101, and when this translucent filtered liquid is returned to the waste water tank 101, it can be collected as a cake, and the density in the waste water tank 101 can be reduced comparatively quickly.

Finally, when the second holding means 155 is released, and then the first holding means 153 is released, the material formed into a cake drops out and can be collected, as shown in FIG. 17F.

Since the cake contains water and would be dispersed as dust if dried, the cake is collected in a closed container 157 or a bag. To store the cake for an extended period of time, a metal laminated bag or a bag that retains moisture is preferable. Thus, if the material to be removed is silica, a common metal, a valuable metal, a rare metal or a semiconductor compound, it can be efficiently collected for recycling. Whereas if the material to be removed is a poisonous metal, such as arsenic, it can be collected without contaminating the outer atmosphere.

In either case, the cake can be carried to a recycling place or an industrial waste disposal place while securely retained in the closed container 157 or bag.

Figure 18A:
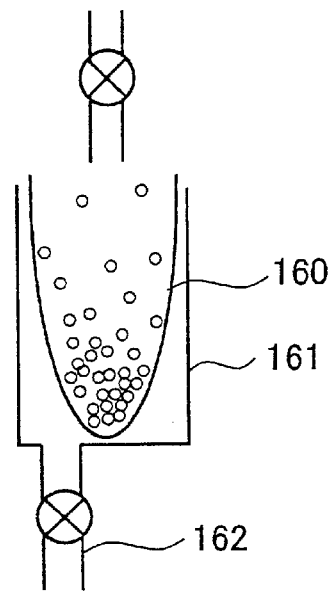
FIGS. 18A and 18B are diagrams for explaining a filtering system installed in a transferring apparatus.

In addition to the filter press 121, a filter device that can collect a material to be removed will now be described while referring to FIGS. 18A and 18B. In FIG. 18A, a bag 160, the bottom opening of which is closed, is attached to the interior of a container 161, and filtered liquid is collected by natural drop. A pipe 162 is attached to the bottom of the container 161, and the filtered liquid is transmitted along the pipe 162 to the filtered liquid tank 125 and from there to the waste water tank 101.

Figure 18B:
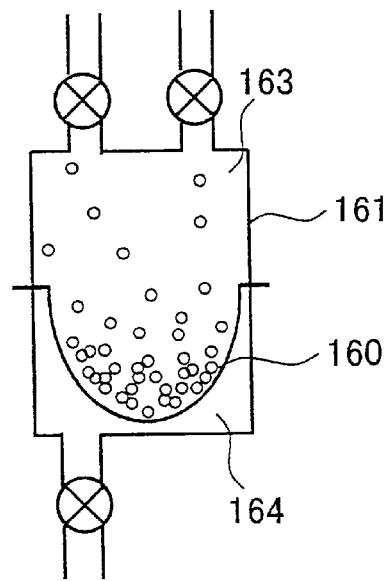

As an improvement of the device in FIG. 18A, in FIG. 18B, a container 161 is separated into an upper space 163 and a lower space 164, with an interposed filter 160. Waste water is filtered by pressing the upper space 163.

Figure 19:
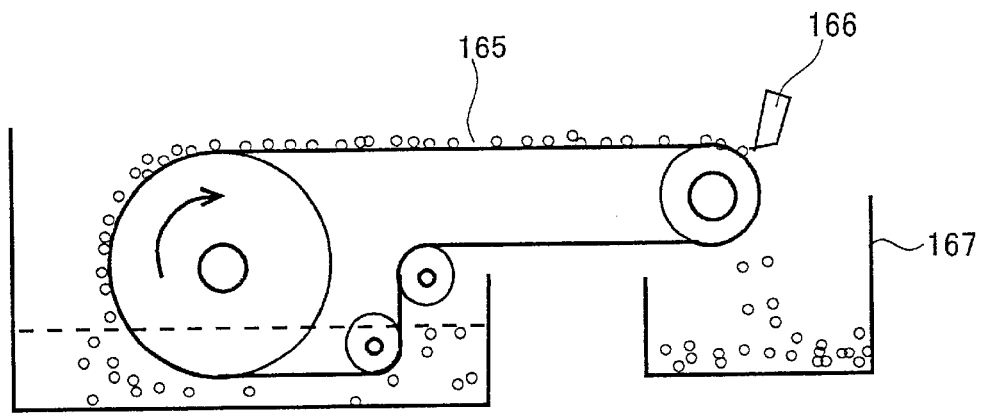
FIG. 19 is a diagram for explaining a filtering system installed in a transferring apparatus

Further, in FIG. 19, a belt 165, on the surface of which a filter is formed, is extended, and a material to be removed is captured by this belt 165. A scraper 166 is used to scrape the surface of the filter and collect, in a container 167, a material to be removed. The waste water wherein the belt 165 is immersed is thereafter returned to the waste water tank 101. In this case, the filtered liquid tank 125 may not necessarily be provided.

As mentioned above, when a filter is made with removables, filter pores smaller than the removables constituting the filter can be formed, and through those small pores still smaller removables can be removed. Consequently, it is possible to remove sub-micron removables smaller than 0.1 μm.

When a fluid including removables is passed through the first filter and a second filter made of the removables is formed on the surface of the first filter, a second filter made up of pores smaller than the pores of the first filter can be made on the surface of the first filter, and it is possible to form a filter having a good filtering performance that can remove smaller removables.

Furthermore because it is made by removables being combined and gaps of various shapes are formed between the removables, entry passages for the fluid can be provided.

As a result of the fluid including removables being recirculated through the first filter, a second filter made up of pores smaller than the pores of the first filter grows on the first filter surface, and because small removables having passed through the pores of the first filter also recirculate, it is possible to form a second filter that can trap small removables having passed through the pores of the first filter.

As a result of removables of different sizes being layered on the filter and the second filter, pores which the fluid can pass through and which can trap small removables can be formed.

As a result of the removables having a particle diameter distribution having two peaks and the size of the pores of the first filter being between the two peaks, large removables of the particle diameter distribution can be trapped. As the trapped removables are layered in various forms, a second filter with small pores is formed, and because gaps through which the fluid can flow are provided between the trapped removables, it is possible to form a filter which can catch small removables and through which the fluid can pass.

Initially, filtered fluid in which small removables are mixed is produced, but by recirculating, a filter can be made to trap even those small removables. Accordingly, if determined that the removables have reached a predetermined degree of concentration, recirculation is then stopped and filtration is started. It is possible to filter to a target filtering accuracy.

If there is a failure such as the first filter breaking down or the second filter crumbling, filtered water containing removables that normally should be trapped is genreated, and has an adverse effect on the reusability of the filtered water. However, when a failure is detected, recirculation can be started immediately. Removables that should be trapped can be returned to the raw water tank and the production of filtered water containing the removables can be completely prevented.

When it is a suction type, the storage vessel in which the fluid is stored and the filter is immersed can be an open type. When it is a pressurized type, the storage vessel is a closed type and necessitates a complicated structure.

Because the second filter is made by removables simply aggregating, if an external force is applied, the whole of the second filter or a surface layer of the second filter can be removed, and it is possible to refresh the filtering performance and maintain the filtering performance.

By using an external force, it is possible to remove removables constituting a cause of clogging and to form gaps between removables, and to provide passages for fluid.

Because a first filter made of a polyolefin high polymer has resistance to alkalis and acids, filtering of fluids with chemicals also becomes possible. Also, coagulating sedimentation can be carried out with the first filter immersed.

As a result of the removables being solids and their particle diameters of being differing sizes, gaps of various shapes can be formed. Consequently, smaller removables can be trapped and more passages for fluid can be provided.

As is apparent from the above explanation, since the density of the waste water in the waste water tank is increased, and since the filter device mounted in the transfer apparatus separates the high density waste water into a cake and a filtered liquid (waste water having a low density) and returns the filtered liquid (waste water having a low density) to the waste water tank, the function of the filter device in the waste water tank can be improved and the dust can be collected as a cake. Further, when the fluid is distilled water and after a pH adjustment has been made and the water is neutral or weakly acidic, the material to be removed does not substantially react in the waste water, so that this material can be recycled.

In addition, since the filter system is mounted in the transfer apparatus, waste water in waste water tanks that are located at various locations can be separated into cake and filtered liquid. Thus, the amount of dust that is collected can be increased, and the recycling efficiency can be improved.

As is described above, according to the present invention, using a simple system, a very fine material to be removed can be separated and collected from waste water wherein the material is suspended. As a result, the amount of industrial waste can be reduced to the minimum, and an environmentally friendly filtering process, which permits the recycling of materials, can be implemented.

What is claimed is:

1. A method for fabricating a semiconductor ingot comprising:

discharging, to a waste tank, not only water but also Si particle generated by machining a crystal ingot into a wafer or machining a semiconductor wafer;

adjusting waste water in said waste water tank to a predetermined density by using a filter device;

transferring said waste water having said predetermined density to collection means;

discharging said waste water under pressure;

using said collection means to generate a block that comprises said Si particle at a predetermined water content and that does not react with a chemical in said waste water tank; and using said block comprising said Si particle as a material to be melted for recycling.

2. A method according to claim 1, wherein water used at said machining step contains carbon dioxide gas.

3. A method for fabricating a semiconductor ingot comprising:

discharging, to a waste tank, not only water but also Si particle generated by machining a crystal ingot into a wafer or machining a semiconductor wafer;

adjusting waste water in said waste water tank to a predetermined density by using a filter device;

transferring said waste water having said predetermined density to collection means;

discharging said waste water under pressure;

using said collection means to generate a block that comprises said Si particle at a predetermined water content and that does not react with a chemical in said waste water tank; and using said block comprising said Si particle as a material to be melted for recycling, wherein machining comprises abrading, grinding, polishing, or dicing.

4. A method for fabricating a semiconductor ingot comprising:

discharging, to a waste tank, not only water but also Si particle generated by machining a crystal ingot into a wafer or machining a semiconductor wafer;

adjusting waste water in said waste water tank to a predetermined density by using a filter device wherein a solid composed of the same material as said Si particle is formed as a second filter on the surface of a first filter;

transferring said waste water having said predetermined density to collection means;

discharging said waste water under pressure;

using said collection means to generate a block that comprises said Si particle at a predetermined water content and that does not react with a chemical in said waste water tank; and using said block consisting of said Si particle as a material to be melted for recycling.

5. A method according to claim 4, wherein said solid is particle dispersed in wastewater.

6. A method according to claim 4 or 5, wherein the surface layer of said second filter is refreshed.

7. A method according to claim 6, wherein, for the refreshment, air bubbles are passed through the surface of said second filter.

* * * * *